(12) United States Patent
Fritsch et al.

(10) Patent No.: US 12,298,341 B2
(45) Date of Patent: May 13, 2025

(54) METHODS AND APPARATUSES FOR ACOUSTICALLY TESTING MEMS DEVICES

(71) Applicant: Fraunhofer-Gesellschaft zur Förderung der angewandten Forschung e.V., Munich (DE)

(72) Inventors: Tobias Fritsch, Ilmenau (DE); Tobias Clauß, Ilmenau (DE); Paul Fritzsche, Ilmenau (DE); Matthias Fiedler, Ilmenau (DE)

(73) Assignee: FRAUNHOFER-GESELLSCHAFT ZUR FÖRDERUNG DER ANGEWANDTEN FORSCHUNG E.V., Munich (DE)

(*) Notice: Subject to any disclaimer, the term of this patent is extended or adjusted under 35 U.S.C. 154(b) by 188 days.

(21) Appl. No.: 17/815,840

(22) Filed: Jul. 28, 2022

(65) Prior Publication Data

US 2022/0365131 A1    Nov. 17, 2022

Related U.S. Application Data

(63) Continuation of application No. PCT/EP2021/051680, filed on Jan. 26, 2021.

(30) Foreign Application Priority Data

Jan. 30, 2020 (DE) .................. 10 2020 201 124.9

(51) Int. Cl.
*G01R 31/28* (2006.01)
(52) U.S. Cl.
CPC ............................. *G01R 31/2881* (2013.01)

(58) Field of Classification Search
None
See application file for complete search history.

(56) References Cited

U.S. PATENT DOCUMENTS

2009/0128171 A1    5/2009    Okumura et al.
2010/0219839 A1    9/2010    Steele et al.
(Continued)

FOREIGN PATENT DOCUMENTS

CN         103803479 A         5/2014
DE    10 2008 015 916 A1    10/2009
(Continued)

OTHER PUBLICATIONS

English Translation of WO 2009071596 A1 (Year: 2009).*
(Continued)

*Primary Examiner* — Jermele M Hollington
(74) *Attorney, Agent, or Firm* — McClure, Qualey & Rodack, LLP

(57) ABSTRACT

Embodiments provide a method for acoustically testing at least one MEMS device of a plurality of MEMS devices. The method comprises a step of providing at least one MEMS device. Additionally, the method comprises a step of exciting the at least one MEMS device to an acoustic vibration. Additionally, the method comprises a step of detecting the acoustic vibration of the at least one MEMS device by at least one sound sensor. Additionally, the method comprises a step of evaluating the acoustic vibration of the at least one MEMS device detected by the at least one sound sensor to test the at least one MEMS device as to an intended functionality.

26 Claims, 17 Drawing Sheets

(56) References Cited

U.S. PATENT DOCUMENTS

| | | | |
|---|---|---|---|
| 2010/0290634 A1 | 11/2010 | Schaule et al. | |
| 2012/0098559 A1 | 4/2012 | Bolt | |
| 2012/0194207 A1* | 8/2012 | Vaganov | G06F 3/0338 |
| | | | 324/750.01 |
| 2014/0134748 A1 | 5/2014 | Liu | |
| 2021/0120352 A1 | 4/2021 | Khenkin et al. | |
| 2021/0377679 A1* | 12/2021 | Lo | H04R 1/2803 |

FOREIGN PATENT DOCUMENTS

| | | | | |
|---|---|---|---|---|
| KR | 10-2007-0083503 A | | 8/2007 | |
| TW | 201101851 A | | 1/2011 | |
| TW | 201441586 A | * | 11/2014 | G01N 29/14 |
| TW | 201842788 A | | 12/2018 | |
| WO | WO-2009071596 A1 | * | 6/2009 | B81C 99/005 |

OTHER PUBLICATIONS

English translation of TW 201441586 A (Year: 2014).*
Chinese language office action dated May 24, 2024, issued in application No. CN 202180023414.4.
Korean language office action dated Apr. 3, 2024, issued in application No. KR 10-2022-7029235.
English language translation of office action dated Apr. 3, 2024.
International Search Report and International Preliminary Examination Report issued in application No. PCT/EP2021/051680.
Casset, F., et al. "A 256 MEMS Membrane Digital Loudspeaker Array Based on PZT Actuators;" Procedia Engineering; vol. 120; Sep. 2015; pp. 49-52.
Ledesma, E., et al.; "ALN Pmut with Crossed-Cavity for Better Acoustic Pressure Outputs in Liquid at High Frequency;" 2019 20th International Conference on Solid-State Sensors, Actuators and Microsystems & Eurosensors XXXIII (Transducers & Eurosensors XXXIII), IEEE; 2019; pp. 825-828.
"Rub & Buzz and Impulsive Distortion;" https://www.klippel.de/knowhow/measurements/nonlinear-distortion/rub-buzz-and-impulsivedistortion.html; pp. 1-4.
Japanese language office action dated Oct. 30, 2023, issued in application No. JP 2022-546416.
English language translation of office action dated Oct. 30, 2023 (pp. 1-9 of attachment).
Ozevin, D., et al.; "Development of a MEMS device for acoustic emission testing;" Proc. SPIE 5057, Smart Structures and Materials 2003: Smart Systems and Nondestructive Evaluation for Civil Infrastructures; Aug. 2003; pp. 64-74.
Hirano, H., et al.; "Particle Removal Method without Damaging to MEMS Structure;" IEEJ Transaction E (Sensors and Micromachines Division's Transaction), General Incorporated Association, The Institute of Electrical Engineers of Japan; vol. 133; No. 5; 2013; pp. 157-163.
English language translation of abstract of "Particle Removal Method without Damaging to MEMS Structure;" (p. 1 of attachment).

* cited by examiner

METHODS AND APPARATUSES FOR ACOUSTICALLY TESTING MEMS DEVICES

CROSS-REFERENCES TO RELATED APPLICATIONS

This application is a continuation of copending International Application No. PCT/EP2021/051680, filed Jan. 26, 2021, which is incorporated herein by reference in its entirety, and additionally claims priority from German Application No. DE 10 2020 201 124.9, filed Jan. 30, 2020, which is incorporated herein by reference in its entirety.

BACKGROUND OF THE INVENTION

Embodiments of the present invention relate to a method for acoustically testing at least one MEMS (Micro-Electro-Mechanical System) device of a plurality of MEMS devices. Further embodiments relate to an apparatus for acoustically testing at least one MEMS device of a plurality of MEMS devices. Some embodiments relate to acoustically testing MEMSs.

Checking microelectromechanical systems (MEMSs) as to their desired mode of functioning involves non-trivial technical problems. Thus, an MEMS, which was proven to be electrically fully functional, may be mechanically defective. Vice versa, a case in which mechanical movement is possible, but no electrical functionality, for example in the case of an electrical short-circuit, is also possible.

Additionally, a purely electrical measurement may be problematic since certain MEMS structures in the desired function are passed by very low currents only and correspondingly high resistances/impedances (range of MOhm or GOhm) are present. The consequence is that metrological methods frequently entail long integration times. As regards optimized production lines, these methods appear to be uneconomical. A potential solution is checking whether an electrical excitation (or stimulation) of the MEMS results in a mechanical movement. This can be performed optically, as is done in the conventional technology, but which represents very high complexity for measurements in more than a single chip. The underlying optics and their form factors are part of the problem. Very expensive measuring distances are needed in very small MEMS structures, which, due to their mode functioning (for example stroboscope), can also be very time-consuming. Furthermore, in the current conventional technology, no optical tests of internal structures of housed or capped MEMSs can be performed, the consequence being that defects resulting from housing/capping cannot be examined. Additionally, optical systems, which are currently being researched, which can expose structures by silicon, i.e. housing/caps, are still limited in their ranges and consequently are unable to examine larger chips completely. The later a defect already present or introduced during the production process is discovered in supply chains, the more expensive the entire manufacturing process will be.

SUMMARY

According to an embodiment, a method for acoustically testing at least one MEMS device of a plurality of MEMS devices may have the steps of: providing the plurality of MEMS devices with the at least one MEMS device, providing a test apparatus and contacting the at least one MEMS device by the test apparatus, exciting the at least one MEMS device via the test apparatus to an acoustic vibration, detecting the acoustic vibration of the at least one MEMS device by at least one sound sensor of the test apparatus, evaluating the acoustic vibration of the at least one MEMS device, detected by the at least one sound sensor, to test the at least one MEMS device as to an intended functionality, wherein the test apparatus is a probe, part of a probe or a test card.

According to another embodiment, a method for acoustically testing at least one MEMS device may have the steps of: providing the at least one MEMS device, exciting the at least one MEMS device to an acoustic vibration, detecting the acoustic vibration of the at least one MEMS device by at least one sound sensor, evaluating the acoustic vibration of the at least one MEMS device, detected by the at least one sound sensor, to test the at least one MEMS device as to an intended functionality, providing a first test apparatus and contacting a first side of the at least one MEMS device by the first test apparatus, wherein the at least one MEMS device is excited via the first test apparatus, providing a second test apparatus and contacting a second side of the at least one MEMS device opposite the first side by the second test apparatus, wherein the second test apparatus comprises the at least one sound sensor.

According to another embodiment, a method for acoustically testing at least one MEMS device may have the steps of: providing the at least one MEMS device, exciting the at least one MEMS device to an acoustic vibration, detecting the acoustic vibration of the at least one MEMS device by at least one sound sensor, evaluating the acoustic vibration of the at least one MEMS device, detected by the at least one sound sensor, to test the at least one MEMS device as to an intended functionality, wherein the at least one MEMS device is a group of MEMS devices, wherein the group of MEMS devices is excited to acoustic vibrations, wherein the acoustic vibrations of the group of MEMS devices are detected by the at least one sound sensor, wherein the at least one sound sensor comprises a plurality of sound sensors, wherein one sound sensor each of the plurality of sound sensors is associated to an MEMS device of the group of MEMS devices, or wherein the at least one sound sensor comprises a plurality of sound sensor arrays, wherein one sound sensor array each of the plurality of sound sensor arrays is associated to an MEMS device of the group of MEMS devices.

According to another embodiment, a method for acoustically testing at least one MEMS device of an integrated circuit or chip during manufacturing of the integrated circuit or chip may have the steps of: providing a partial product of the integrated circuit or chip with the at least one MEMS device, exciting the at least one MEMS device to an acoustic vibration, detecting the acoustic vibration of the at least one MEMS device by at least one sound sensor, evaluating the acoustic vibration of the at least one MEMS device, detected by the at least one sound sensor, to test the at least one MEMS device as to an intended functionality.

Another embodiment may have a non-transitory digital storage medium having a computer program stored thereon to perform the method for acoustically testing at least one MEMS device of a plurality of MEMS devices, wherein the method has the steps of: providing the plurality of MEMS devices with the at least one MEMS device, providing a test apparatus and contacting the at least one MEMS device by the test apparatus, exciting the at least one MEMS device via the test apparatus to an acoustic vibration, detecting the acoustic vibration of the at least one MEMS device by at least one sound sensor of the test apparatus, evaluating the acoustic vibration of the at least one MEMS device, detected by the at least one sound sensor, to test the at least one MEMS device as to an intended functionality, wherein the test apparatus is a probe, part of a probe or a test card, when said computer program is run by a computer.

Another embodiment may have a test apparatus for acoustically testing at least one MEMS device of a plurality of MEMS devices arranged on a wafer, wherein the test apparatus is configured to contact at least one MEMS device of the plurality of MEMS devices arranged on the wafer, wherein the test apparatus is configured to excite the at least one MEMS device to an acoustic vibration, wherein the test apparatus comprises at least one sound sensor configured to detect the acoustic vibration of the at least one MEMS device, wherein the test apparatus is configured to provide at least one signal which is dependent on the acoustic vibration of the at least one MEMS device detected by the sound sensor, wherein the test apparatus is a probe, part of a probe or a test card.

Another embodiment may have an apparatus for acoustically testing at least one MEMS device of a plurality of MEMS devices arranged on a wafer, wherein the apparatus comprises a first test apparatus and a second test apparatus, wherein the first test apparatus is configured to contact a first side of the at least one MEMS device of the plurality of MEMS devices arranged on the wafer, wherein the first test apparatus is configured to excite the at least one MEMS device to an acoustic vibration, wherein the second test apparatus is configured to contact a second side of the at least one MEMS device opposite the first side, wherein the second test apparatus comprises at least one sound sensor configured to detect the acoustic vibration of the at least one MEMS device, wherein the apparatus is configured to evaluate the acoustic vibration of the at least one MEMS device detected by the at least one sound sensor to test the at least one MEMS device as to an intended functionality.

Embodiments provide a method for acoustically testing at least one MEMS device. The method comprises a step of providing the at least one MEMS device. In addition, the method comprises a step of exciting the at least one MEMS device to an acoustic vibration (or oscillation). Additionally, the method comprises a step of detecting the acoustic vibration of the at least one MEMS device by at least one sound sensor (or acoustic sensor). Additionally, the method comprises a step of evaluating the acoustic vibration of the at least one MEMS device, detected by the at least one sound sensor, to test the at least one MEMS device as to an intended functionality.

In embodiments, a wafer comprising a plurality of MEMS devices can be provided in providing the at least one MEMS device, wherein at least one MEMS device of the plurality of MEMS devices can be excited in exciting the at least one MEMS device.

In embodiments, the at least one MEMS device can be tested on the wafer level before dicing the plurality of MEMS devices.

In embodiments, an integrated circuit or chip comprising the at least one MEMS device can be provided in providing the at least one MEMS device.

In embodiments, the at least one MEMS device can be tested while manufacturing the integrated circuit or chip.

In embodiments, the at least one MEMS device can be tested at the end of manufacturing the integrated circuit or chip.

In embodiments, the method can additionally comprise providing a test apparatus and contacting the at least one MEMS device by the test apparatus, wherein the at least one MEMS device is excited by the test apparatus.

In embodiments, the test apparatus can be a probe, a part of a probe or a test card.

In embodiments, the test apparatus can comprise the at least one sound sensor.

In embodiments, the test apparatus can be at least partly acoustically transmissive at least in a region adjacent to the at least one MEMS device, wherein the at least one sound sensor can be arranged adjacent to the at least partly acoustically transmissive region of the test apparatus.

In embodiments, the at least one MEMS device can be a group of MEMS devices, wherein the test apparatus is at least partly acoustically transmissive at least in regions adjacent to the group of MEMS devices, wherein the at least one sound sensor is arranged adjacent to the at least partly acoustically transmissive regions of the test apparatus.

In embodiments, the test apparatus can be a first test apparatus, the first test apparatus contacting a first side of the at least one MEMS device, wherein the method can additionally comprise providing a second test apparatus and contacting a second side of the at least one MEMS device opposite the first side by the second test apparatus, the second test apparatus comprising the at least one sound sensor.

In embodiments, the second test apparatus can comprise a support for the wafer, the support being at least partly acoustically transmissive at least in a region adjacent to the at least one MEMS device, wherein the at least one sound sensor is arranged adjacent to the at least partly acoustically transmissive regions of the support.

In embodiments, the at least one MEMS device can be a group of MEMS devices, wherein the support is at least partly acoustically transmissive at least in regions adjacent to the group of MEMS devices, wherein the at least one sound sensor is arranged adjacent to the at least partly acoustically transmissive regions of the support.

In embodiments, the at least one MEMS device can be a group of MEMS devices, wherein the group of MEMS devices is excited to acoustic vibrations, wherein the acoustic vibrations of the group of MEMS devices are detected by the at least one sound sensor.

In embodiments, the at least one sound sensor can be precisely one sound sensor associated to the group of MEMS devices.

In embodiments, the at least one sound sensor can comprise precisely one sound sensor array associated to the group of MEMS devices.

In embodiments, the at least one sound sensor can comprise a plurality of sound sensors, wherein one sound sensor each of the plurality of sound sensors is associated to an MEMS device of the group of MEMS devices.

In embodiments, the at least one sound sensor can comprise a plurality of sound sensor arrays, wherein one sound sensor array each of the plurality of sound sensor arrays is associated to an MEMS device of the group of MEMS devices.

In embodiments, the plurality of sound sensors or sound sensor arrays can be mutually acoustically shielded.

In embodiments, the MEMS devices of the group of MEMS devices can be mutually acoustically shielded.

In embodiments, the group of MEMS devices can be excited simultaneously by different signals which do not overlap in frequency.

In embodiments, the group of MEMS devices can be excited simultaneously by different signals which overlap in frequency.

In embodiments, the group of MEMS devices can be excited successively by the same signal.

In embodiments, the group of MEMS devices can be excited simultaneously.

In embodiments, the at least one MEMS device can be an MEMS loudspeaker, MEMS microphone, MEMS pump, MEMS drive, MEMS transmission or MEMS-based medical test apparatus.

In embodiments, the at least one sound sensor can be a microphone or structure-borne sound sensor.

Further embodiments provide a test apparatus for acoustically testing at least one MEMS device of a plurality of MEMS devices arranged on a wafer, the test apparatus being configured to contact at least one MEMS device of the plurality of MEMS devices arranged on the wafer, the test apparatus being configured to excite the at least one MEMS device to an acoustic vibration, the test apparatus comprising at least one sound sensor configured to detect the acoustic vibration of the at least one MEMS device, the test apparatus being configured to provide at least one signal which depends on the acoustic vibration of the at least one MEMS device, detected by the sound sensor, the test apparatus being a probe or test card.

Further embodiments provide an apparatus for acoustically testing at least one MEMS device of a plurality of MEMS devices arranged on a wafer, the apparatus comprising a first test apparatus and a second test apparatus, the first test apparatus being configured to contact a first side of the at least one MEMS device of the plurality of MEMS devices arranged on the wafer, the first test apparatus being configured to excite the at least one MEMS device to an acoustic vibration, the second test apparatus being configured to contact a second side of the at least one MEMS device opposite the first side, the second test apparatus comprising at least one sound sensor configured to detect the acoustic vibration of the at least one MEMS device, the apparatus being configured to evaluate the acoustic vibration of the at least one MEMS device, detected by the at least one sound sensor, to test the at least one MEMS device as to an intended functionality.

Further embodiments provide methods, apparatuses and computer programs for acoustically testing and acoustically characterizing microelectromechanical systems (MEMSs).

BRIEF DESCRIPTION OF THE DRAWINGS

Embodiments of the present invention will be detailed subsequently referring to the appended drawings, in which.

DETAILED DESCRIPTION OF THE INVENTION

Figure 1:
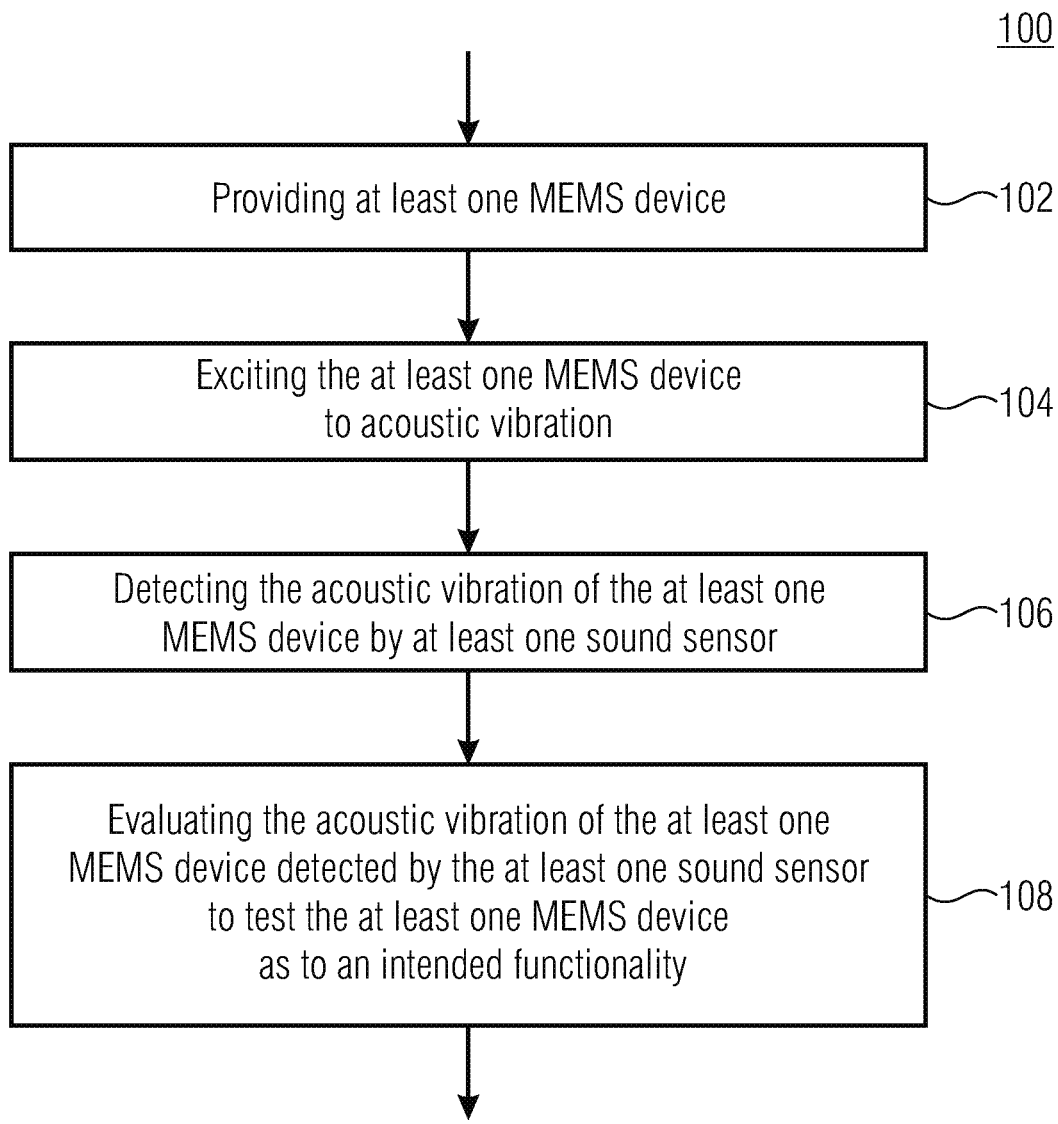
FIG. 1 shows a flow chart of a method for acoustically testing at least one MEMS device of a plurality of MEMS devices, in accordance with an embodiment of the present invention.

In the following description of embodiments of the present invention, equal elements or elements of equal effect will be provided with equal reference numerals in the drawings so that the description thereof is mutually interchangeable.

FIG. 1 shows a flow chart of a method 100 for acoustically testing at least one MEMS device of a plurality of MEMS devices, in accordance with an embodiment of the present invention. The method 100 comprises a step 102 of providing at least one MEMS device. In addition, the method 100 comprises a step 104 of exciting the at least one MEMS device to an acoustic vibration. Additionally, the method 100 comprises a step 106 of detecting the acoustic vibration of the at least one MEMS device by at least one sound sensor. In addition, the method 100 comprises a step 108 of evaluating the acoustic vibration of the at least one MEMS device, detected by the at least one sound sensor, to test the at least one MEMS device as to an intended functionality.

In embodiments, in step 102, a wafer comprising a plurality of MEMS devices can be provided, wherein, in step 104, at least one MEMS device of the plurality of MEMS devices is excited to an acoustic vibration. Of course, in step 104, more (like a true subset, for example) or all of the plurality of MEMS devices can be excited to an acoustic vibration, i.e. one after the other, in groups or simultaneously. Thus, it is possible to test at least one, more or all of the plurality of MEMS devices on the wafer level before dicing the plurality of MEMS devices, for example as to an intended functionality.

In embodiments, in step 102, individual or several already diced MEMS devices can of course also be provided and be excited to an acoustic vibration, in step 104, to test them as to an intended functionality, for example before and/or after packaging.

In addition, in embodiments, in step 102, a partial product or final product comprising at least one MEMS device can be provided and, in step 104, excited to an acoustic vibration to test the same as to an intended functionality. Thus, it is possible to test a product comprising at least one MEMS device during manufacturing the product (i.e. in-line) or directly after manufacturing the product (i.e. end-of-line).

Embodiments of the present invention allow testing at least one MEMS device during or after manufacturing the same, before or after packaging the same or during or after integrating the same in a product.

Subsequently, detailed embodiments of the method 100 shown in FIG. 1 and a computer program for executing the same, and a corresponding apparatus will be described in greater detail.

Embodiments allow acoustic testing and/or acoustic characterization of one or more MEMS devices, for example in a manual, semi-automatic or fully automatic implementation in the fields of semiconductor manufacturing, and in the fields of production lines or product value chains. Embodiments can thus relate to each step of the value chain within the production line of the entire production process or a part thereof. Thus, the respective embodiments can comprise one or several sub-aspects, which will be described below briefly.

In embodiments, acoustic testing and/or acoustic characterization one or more MEMS devices, in the region of semiconductor manufacturing, comprises, among other things, wafer testing, for example by means of manual or semi-automatic tests using a probe (probe testing) or fully automatic tests using a probe card for the wafer (wafer probe card testing), as well as tests during assembly (assembly testing), like tests after molding/packaging and further suitable or semiconductor-specific manufacturing steps.

In embodiments, the acoustic testing and/or acoustic characterization of one or more MEMS devices in the field of semiconductor manufacturing, production lines or product value chains comprises any test possible in the chain during manufacturing (in-line testing), like tests during assembly of the printed circuit board (PCB assembly testing or in-circuit test) or tests after a temperature step (post-temperature testing) or stress testing, and tests after manufacturing (end-of-line testing) of the corresponding product or product sub-step.

Embodiments of acoustic testing and acoustic characterization relate to one or more DUTs (DUT=device under test), wherein, in the field of semiconductor manufacturing, DUT refers to chips or sub-structures of the chips and, in the field of production lines, to products or sub-products having the integrated MEMS, which are checked as to their electrical and/or mechanical parameters by means of electrical or mechanical or electromechanical excitation/activation/signals, and these functions are evaluated from the point of view of defined and/or established acoustic tests.

Exemplarily, the DUTs can be classified into four groups by means of the evaluation: 1.) DUT exhibits complete acoustic functionality (characterization green, for example), 2.) DUT exhibits restricted acoustic functionality, but within defined acoustic limits (characterization yellow, for example), 3.) DUT exhibits restricted acoustic functionality but outside defined acoustic limits (characterization orange, for example) and 4.) DUT does not exhibit acoustic functionality (red). In embodiments, the DUTs can of course also be classified into a different number of groups by means of evaluation, like two groups, for example: 1.) DUT functional and 2.) DUT non-functional.

For evaluating the DUT, acoustic tests described below can, for example, be used and acoustic limits of the DUT be defined, for example.

In embodiments, time-efficient recognition of individual defective DUTs can be performed by means of narrow-banded simultaneous excitation of many DUTs using distinguishable stimuli.

In embodiments, testing individual DUTs as to the obtained sound pressure level can be performed by means of broad-band excitation.

In embodiments, acoustic examinations in accordance with the "rub and buzz" principle can be performed. Scratch or rattling noise caused by loose or too tight devices can specifically be searched for. Exemplarily, a defect generates a narrow-banded excitation which results in a broad-band spectrum. Here, insulation or compensation of the environmental noises can be performed.

In embodiments, the DUT can be tested with regard to resonance frequency, intermodulation distortion, multi-tone distortion, total harmonic distortion and/or phase response/group delay.

In embodiments, using microphone arrays allows recognizing and defining emission characteristics of individual DUTs via interferences, for example, or the Moiré effect. Additionally, defect regions on the wafer can be recognized very quickly. This may, for example, serve as a short-term test to recognize fatal production errors at an early stage. In addition, a parallel measurement of any DUTs can be realized by means of a measurement with impulses, while considering the time delay.

In embodiments, the DUTs can be subjected to an acoustic stress test.

In embodiments, apparatuses for accommodating the MEMS or DUT, the probe and/or further apparatuses or devices used for acoustic checking are extended and/or supplemented by a specific setup described below. The primary action here is placing a sound sensor (like a microphone or structure-borne sound sensor) or sound sensor array (like a microphone array or structure-borne sound sensor array, for example) at an acoustically sensible position, for example above the sound exit holes of the DUT, in direct proximity to one or more DUTs. Thus, sensibly placing the probe in semiconductor manufacturing, depending on the production method and the test variation of the MEMS, is represented by the position above or below the wafer or chip. This can vary considerably in production lines and is connected only to the primary point mentioned before. The secondary point is ensuring correct electrical, mechanical or electromechanical driving of one or more DUTs. Both in semiconductor production and in production lines, electrical driving can be performed using suitable electrical contacts, like microscopic needles or pins, for example, by means of the contact pressure corresponding to the application scenario. If required, mechanical driving can be achieved using suitable actuators, like loudspeakers, for example.

Specific embodiments of the present invention will be described below.

1. Wafer Testing

In embodiments, acoustic checking and/or acoustic characterization (of one or more MEMS) can be performed after finishing the wafer having the still pure MEMS ICs (IC=integrated circuit).

1.1 Acoustic Probe Testing

Figure 2:
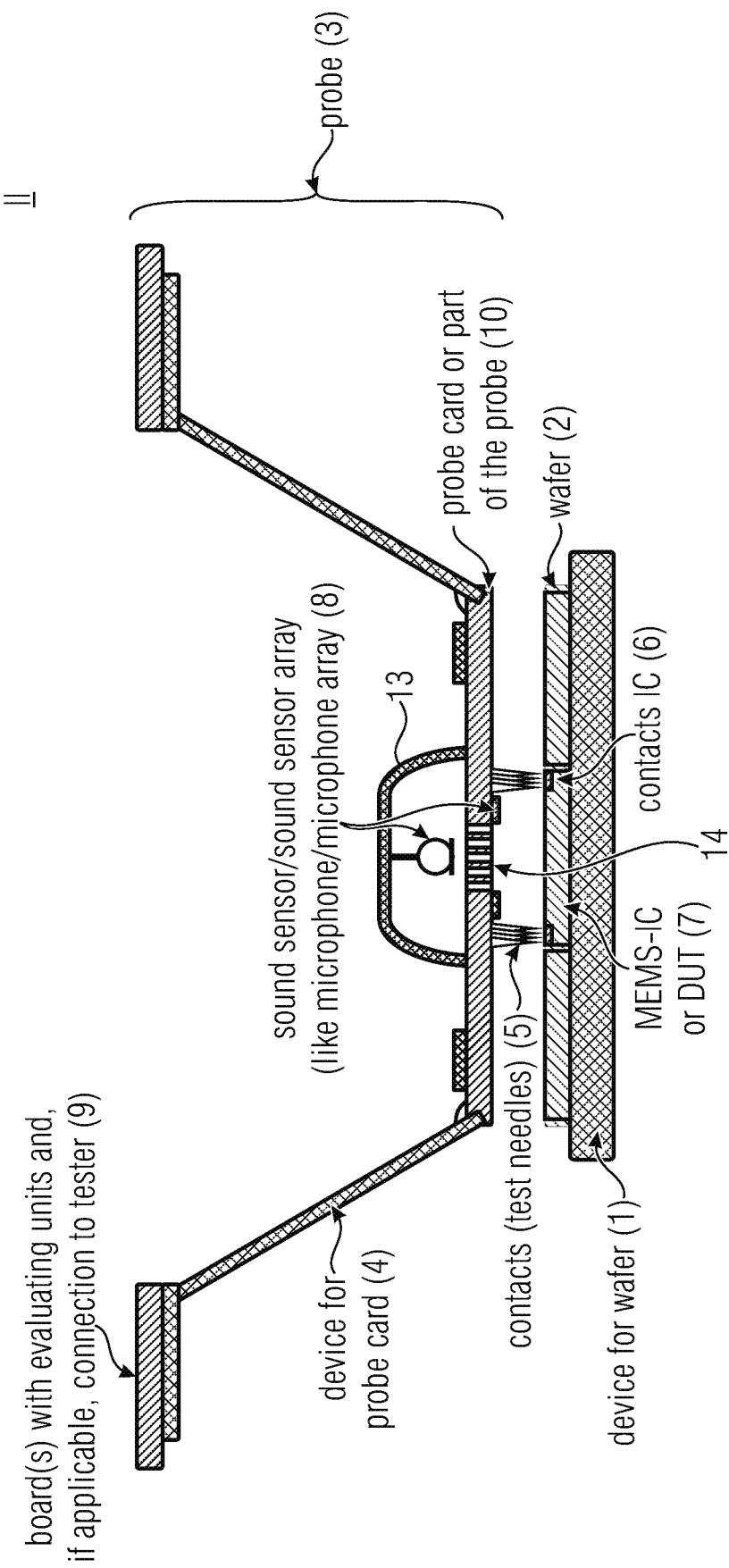
FIG. 2 is a schematic view of an apparatus for acoustically testing at least one MEMS device of a plurality of MEMS devices on the wafer level, in accordance with an embodiment.

FIG. 2 shows a schematic view of an apparatus 11 for acoustically testing at least one MEMS device 7 of a plurality of MEMS devices on the wafer level, in accordance with an embodiment.

The apparatus 11 can comprise an accommodation device 1 for accommodating (and, for example, for positioning) the wafer 2 having the plurality of MEMS devices. In addition, the apparatus 11 can comprise a test apparatus 10 (like a probe card, probe or part of a probe, for example) configured to contact the at least one MEMS device 7 and excite, for example mechanically or electrically, the at least one MEMS device 7 to an acoustic vibration, for example by means of test needles 5 which contact the contacts 6 of the at least one MEMS device 7. The test apparatus 10 can additionally comprise at least one sound sensor 8 (like microphone) configured to detect the acoustic vibration of the at least one MEMS device 7.

The at least one sound sensor 8 here can be arranged adjacent to the at least one MEMS device 7, for example in the region of an emission angle (like main emission angle, for example) of the acoustic vibration of the at least one MEMS device 7, like in the region between (or adjacent to) the test needles 5 which contact the at least one MEMS device 7, and/or above a region 14 of the test apparatus 10 which is arranged adjacent to the at least one MEMS device 7, and which is at least partly acoustically transmissive (for example by means of sound holes). The apparatus 11 (like the test apparatus 10, for example) can optionally comprise (for example if required) an acoustic shielding device 13 (like noise protection) configured to shield the at least one sound sensor 8 from the environment and/or other MEMS devices of the plurality of MEMS devices.

As is exemplarily shown in FIG. 2, the test apparatus 10 can be a probe card or part of a probe 3 of the apparatus 11. The probe 3 can, for example, comprise a device 4 for the probe card 10 and, for example, a board 9 having evaluating units and, if applicable, a connection to a tester.

In other words, FIG. 2 shows a schematic view of an apparatus for acoustic probe testing, in accordance with an embodiment, in which an individual DUT (MEMS device) is tested by means of a single sound sensor (microphone, for example).

Although, in the embodiment shown in FIG. 2, it is exemplarily assumed that a single MEMS device 7 of the plurality of MEMS devices is tested by means of a single sound sensor 8, it is pointed out that the present invention is not limited to such embodiments. Rather, in embodiments, a single MEMS device, a group of MEMS devices or all the MEMS devices of the plurality of MEMS devices can be tested acoustically. Here, one sound sensor or sound sensor array each can be used per MEMS device or one sound sensor or sound sensor array for several MEMS devices (like a group of MEMS devices having at least two MEMS devices) or all the MEMS devices of the plurality of MEMS devices. These different implementations will be discussed below briefly referring to FIGS. 3 to 14.

Figure 3:
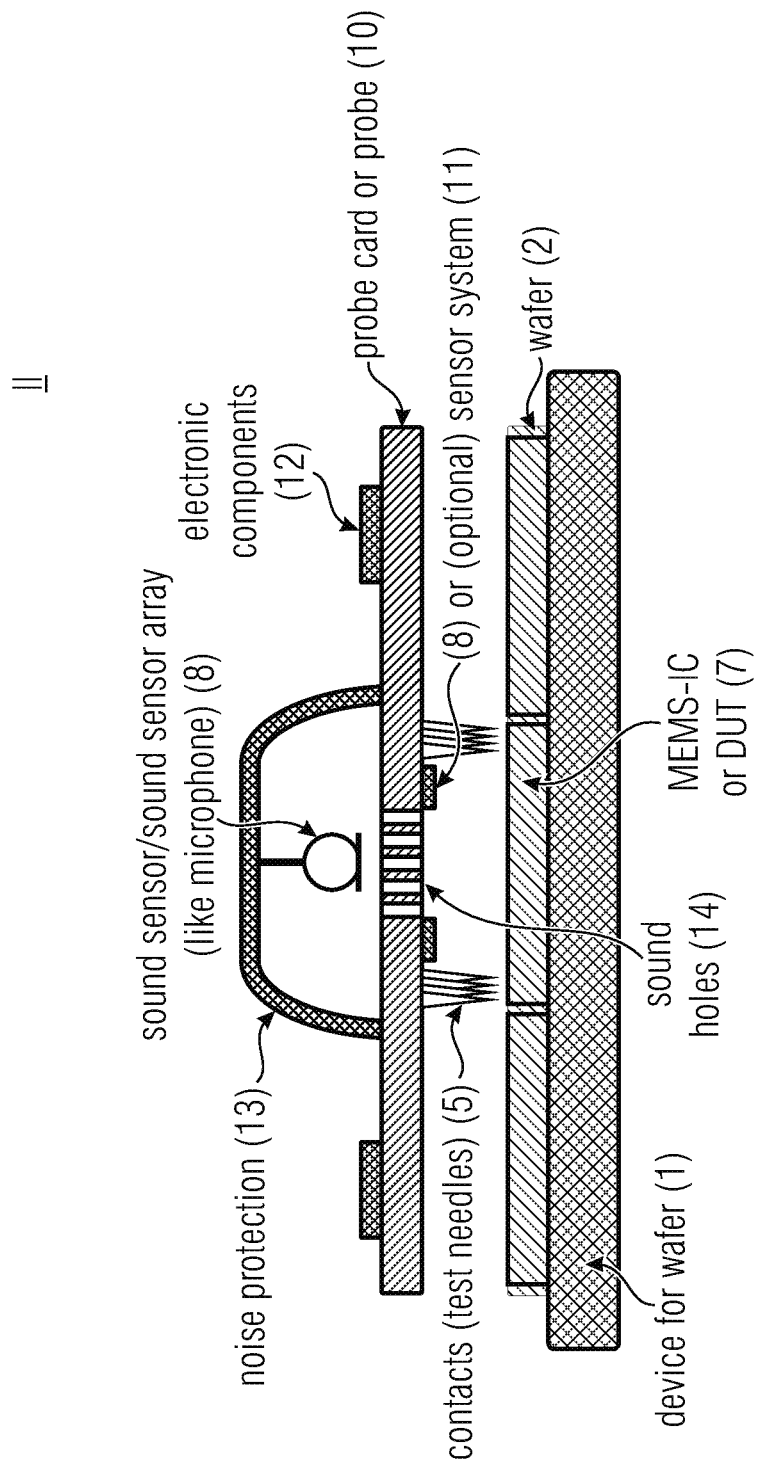
FIG. 3 is a schematic view of an apparatus for acoustically testing an MEMS device of a plurality of MEMS devices on the wafer level using a sound sensor, in accordance with an embodiment.

FIG. 3 shows a schematic view of an apparatus 11 for acoustically testing an MEMS device 7 of a plurality of MEMS devices on the wafer level using a sound sensor 8, in accordance with an embodiment. In analogy to the embodiment shown in FIG. 2, the test apparatus 10 can comprise a sound sensor 8 arranged adjacent to the one MEMS device 7 of the plurality of MEMS devices. In other words, FIG. 3 shows a so-called single DUT test (MEMS device test) by means of a single sound sensor (like microphone, for example).

Figure 4:
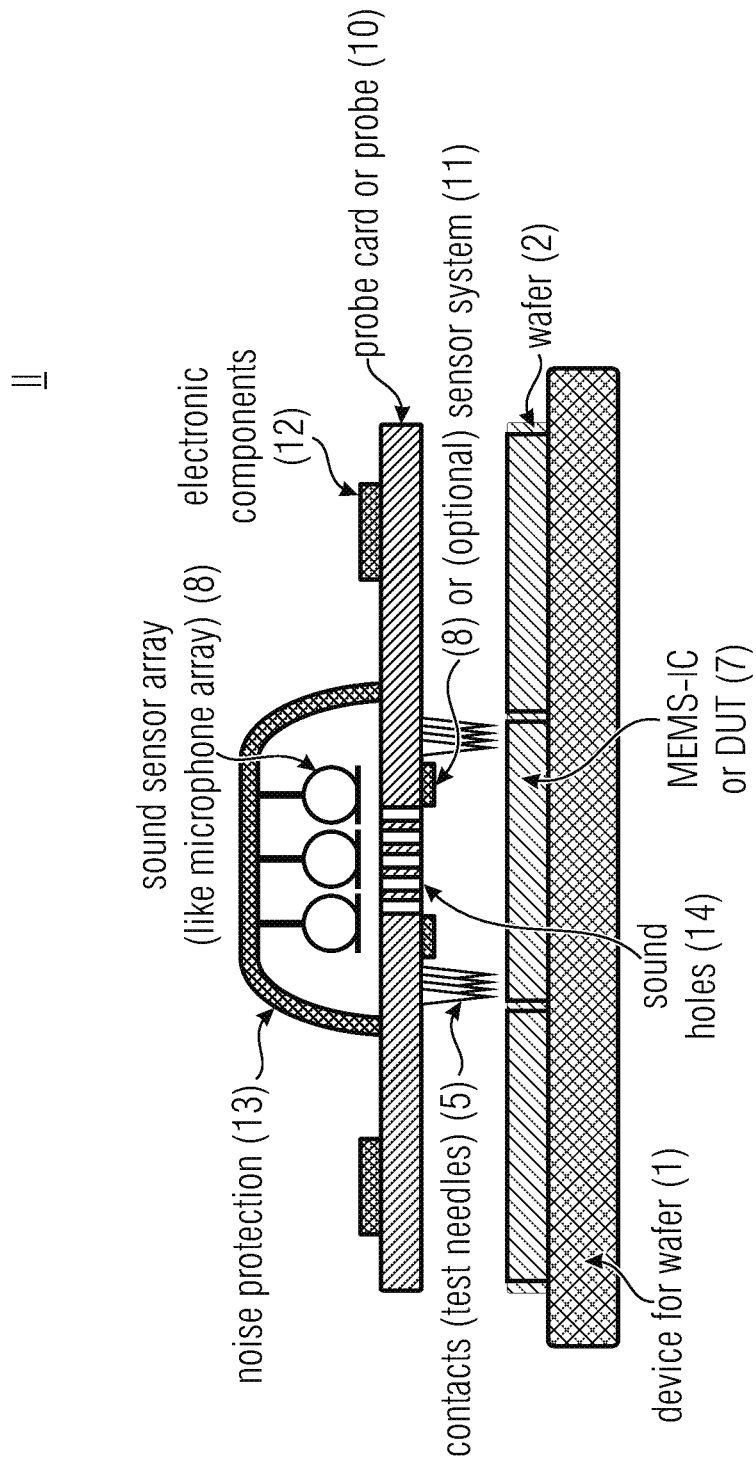
FIG. 4 is a schematic view of an apparatus for acoustically testing an MEMS device of a plurality of MEMS devices on the wafer level using a sound sensor array, in accordance with an embodiment.

FIG. 4 shows a schematic view of an apparatus 11 for acoustically testing an MEMS device 7 of a plurality of MEMS devices on the wafer level using a sound sensor array 8, in accordance with an embodiment. When compared to the embodiment shown in FIG. 3, in the embodiment shown in FIG. 4, a sound sensor array (like microphone array, for example) 8 can be used for acoustically testing the MEMS device 7 instead of a single sound sensor. In other words, FIG. 4 shows a so-called single DUT (MEMS device) test by means of a sound sensor array (like microphone array, for example).

Figure 5:
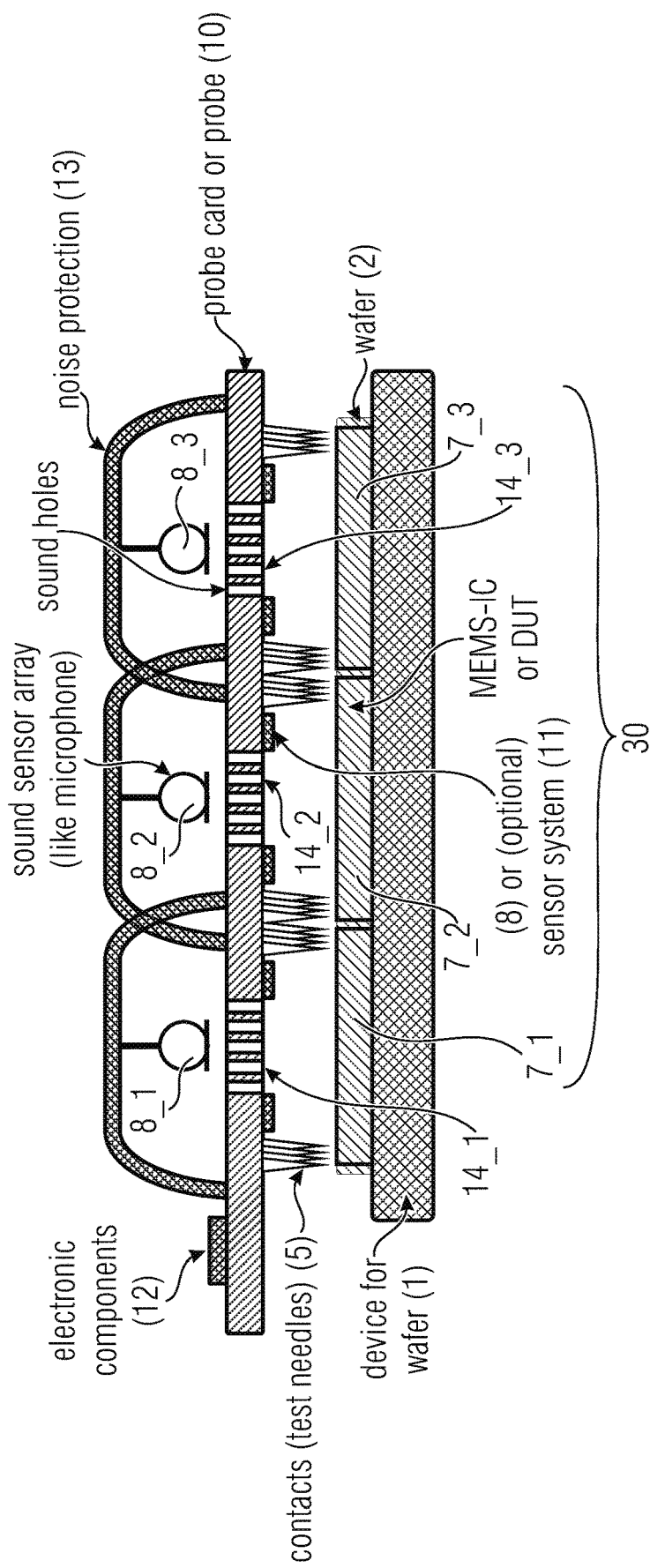
FIG. 5 is a schematic view of an apparatus for acoustically testing a group of MEMS devices of a plurality of MEMS devices on the wafer level using one sound sensor per MEMS device of the group of MEMS devices, in accordance with an embodiment.

FIG. 5 shows a schematic view of an apparatus 11 for acoustically testing a group 30 of MEMS devices 7_1-7_3 of a plurality of MEMS devices on the wafer level using one sound sensor 8_1-8_3 per MEMS device 7_1-7_3 of the group 30 of MEMS devices 7_1-7_3, in accordance with an embodiment. When compared to the embodiment shown in FIG. 3, in the embodiment shown in FIG. 5, a group 30 of MEMS devices 7_1-7_3 can be tested, wherein one sound sensor 8_1-8_3 each is associated to each MEMS device of the group 30 of MEMS devices 7_1-7_3. The sound sensors 8_1-8_3 here can be arranged adjacent to the respective MEMS device 7_1-7_3 of the group 30 of MEMS devices 7_1-7_3, like in the region between (or adjacent to) the test needles which contact the respective MEMS device 7_1-7_3, and/or above a respective region 14_1-14_3 of the test apparatus 10 which is arranged adjacent to the respective MEMS device 7_1-7_3, and which is at least partly acoustically transmissible (for example by means of sound holes). In other words, FIG. 5 shows a so-called multiple DUT (MEMS device) test by means of a single sound sensor (like microphone, for example) per DUT.

Figure 6:
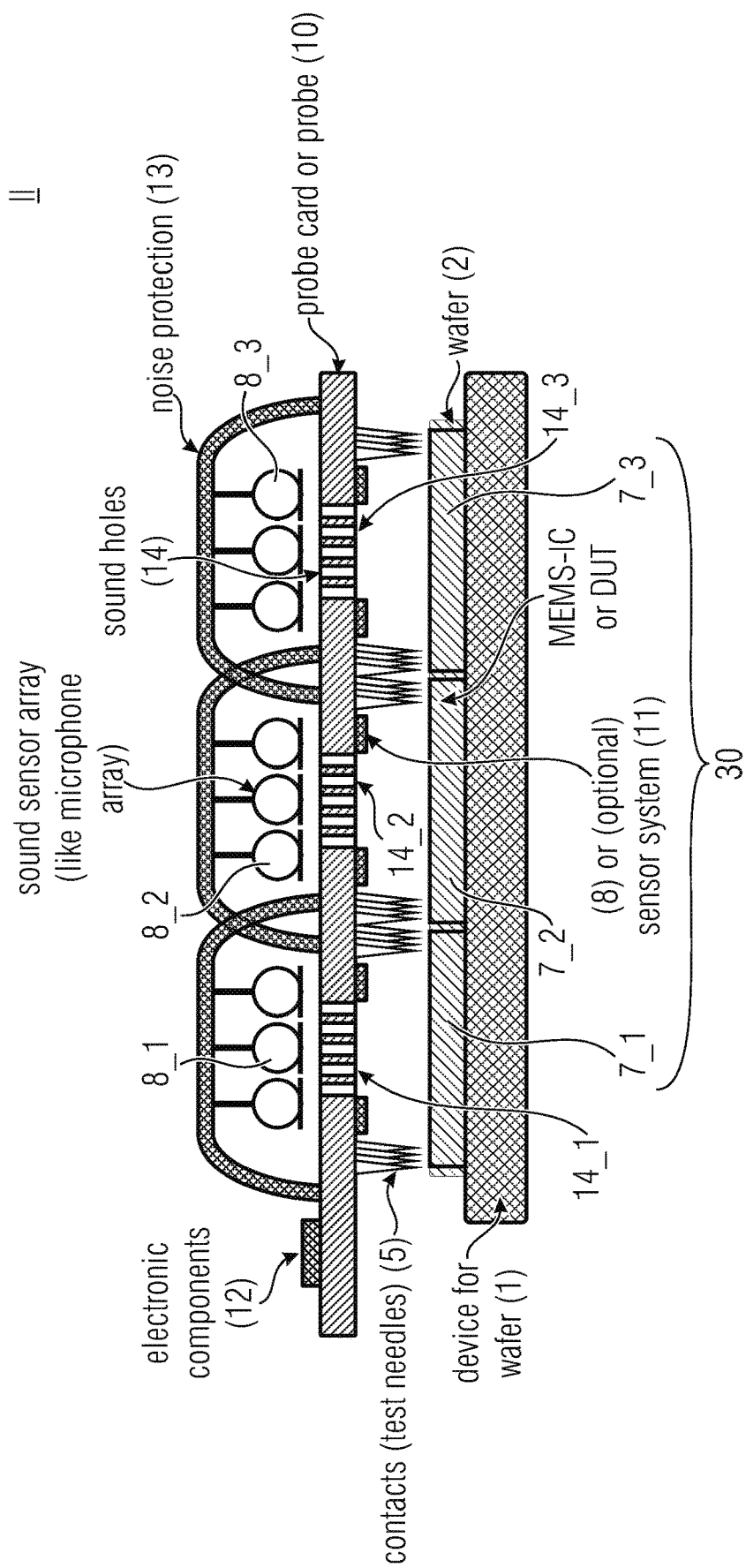
FIG. 6 is a schematic view of an apparatus for acoustically testing a group of MEMS devices of a plurality of MEMS devices on the wafer level using one sound sensor array per MEMS device of the group of MEMS devices, in accordance with an embodiment.

FIG. 6 shows a schematic view of an apparatus 11 for acoustically testing a group 30 of MEMS devices 7_1-7_3 of a plurality of MEMS devices on the wafer level using a sound sensor array 8_1-8_3 per MEMS device 7_1-7_3 of the group 30 of MEMS devices 7_1-7_3, in accordance with an embodiment. When compared to the embodiment shown in FIG. 5, in the embodiment shown in FIG. 6, instead of one sound sensor per MEMS device, one sound sensor array 8_1-8_3 can be used per MEMS device 7_1-7_3 of the group 30 of MEMS devices 7_1-7_3. In other words, FIG. 6 shows a so-called multiple DUT (MEMS device) test by means of one sound sensor array (like microphone array, for example) per DUT.

Figure 7:
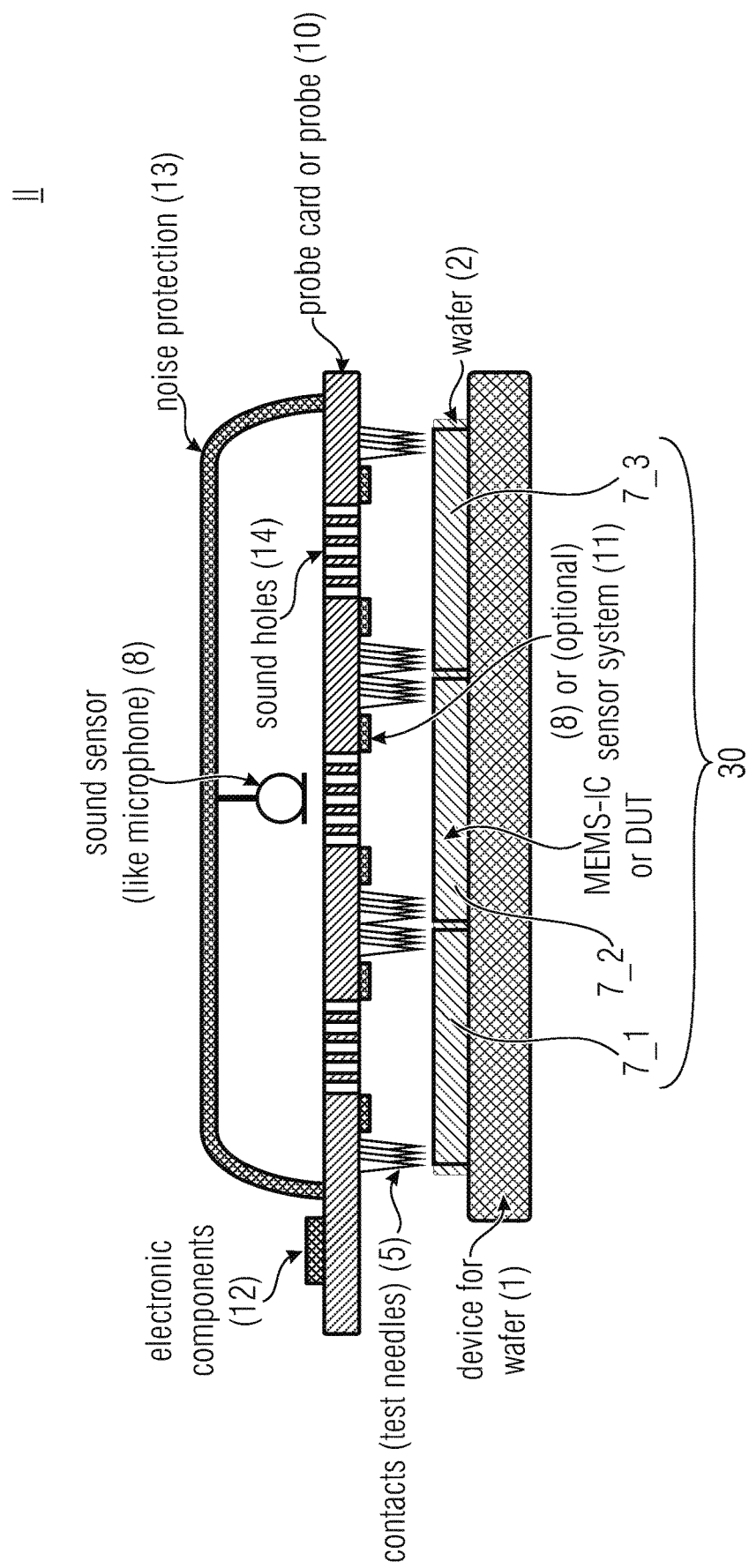
FIG. 7 is a schematic view of an apparatus for acoustically testing a group of MEMS devices of a plurality of MEMS devices on the wafer level using a sound sensor for the group of MEMS devices, in accordance with an embodiment.

FIG. 7 shows a schematic view of an apparatus 11 for acoustically testing a group 30 of MEMS devices 7_1-7_3 of a plurality of MEMS devices on the wafer level using a sound sensor 8 for the group 30 of MEMS devices 7_1-7_3, in accordance with an embodiment. When compared to the embodiment shown in FIG. 5, in the embodiment shown in FIG. 7, a single sound sensor 8 can be used for acoustically testing the group 30 of MEMS devices 7_1-7_3 instead of one sound sensor per MEMS device. In other words, FIG. 7 shows a so-called multiple DUT (MEMS device) test by means of a single sound sensor (like microphone, for example).

Figure 8:
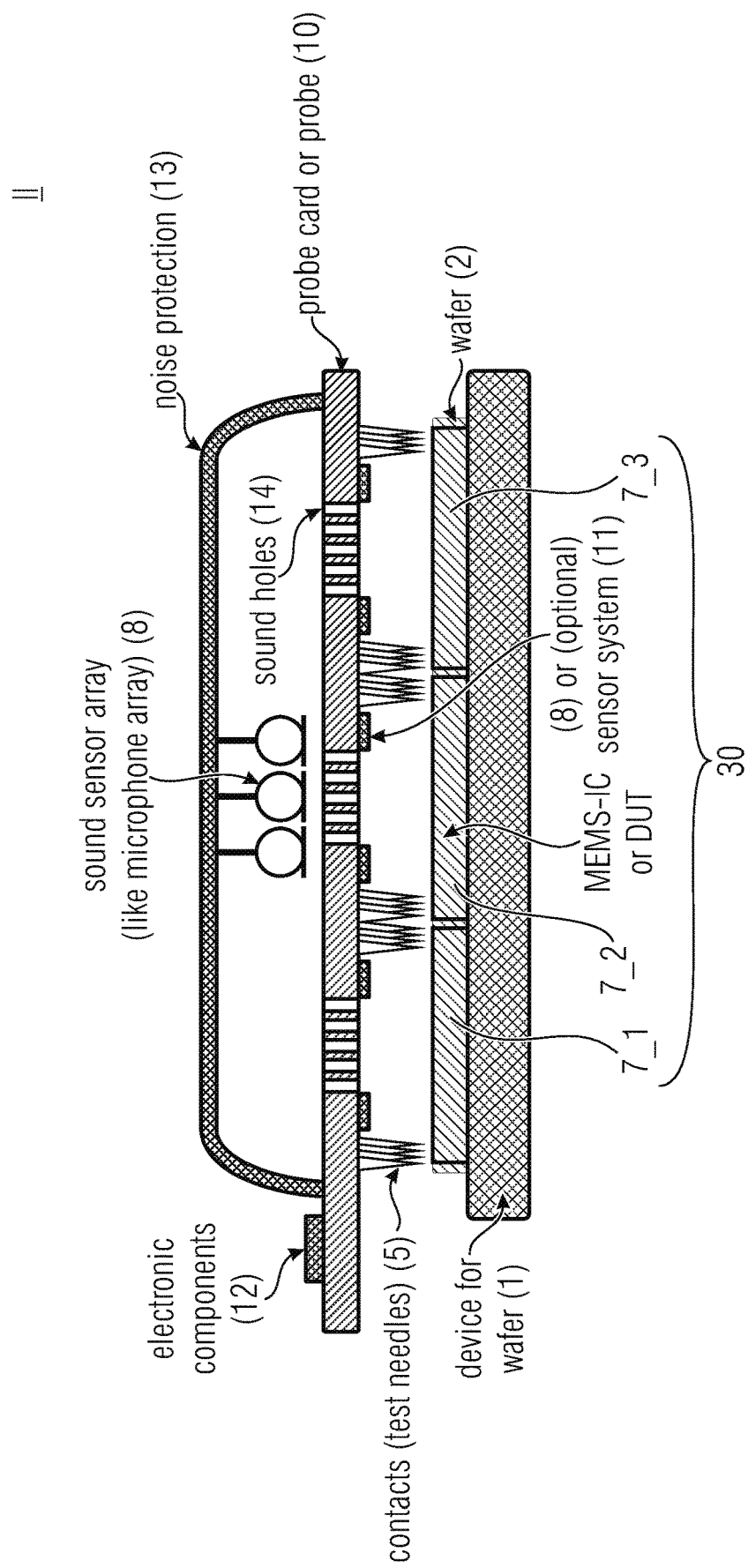
FIG. 8 is a schematic view of an apparatus for acoustically testing a group of MEMS devices of a plurality of MEMS devices on the wafer level using a sound sensor array for the group of MEMS devices, in accordance with an embodiment.

FIG. 8 shows a schematic view of an apparatus 11 for acoustically testing a group 30 of MEMS devices 7_1-7_3 of a plurality of MEMS devices on the wafer level using a sound sensor array 8 for the group 30 of MEMS devices 7_1-7_3, in accordance with an embodiment. When compared to the embodiment shown in FIG. 7, in the embodiment shown in FIG. 8, a sound sensor array 8 can be used for acoustically testing the group 30 of MEMS devices 7_1-7_3, instead of a single sound sensor. In other words, FIG. 8 shows a so-called multiple DUT (MEMS device) test by means of a single sound sensor array (like microphone array, for example).

Figure 9:
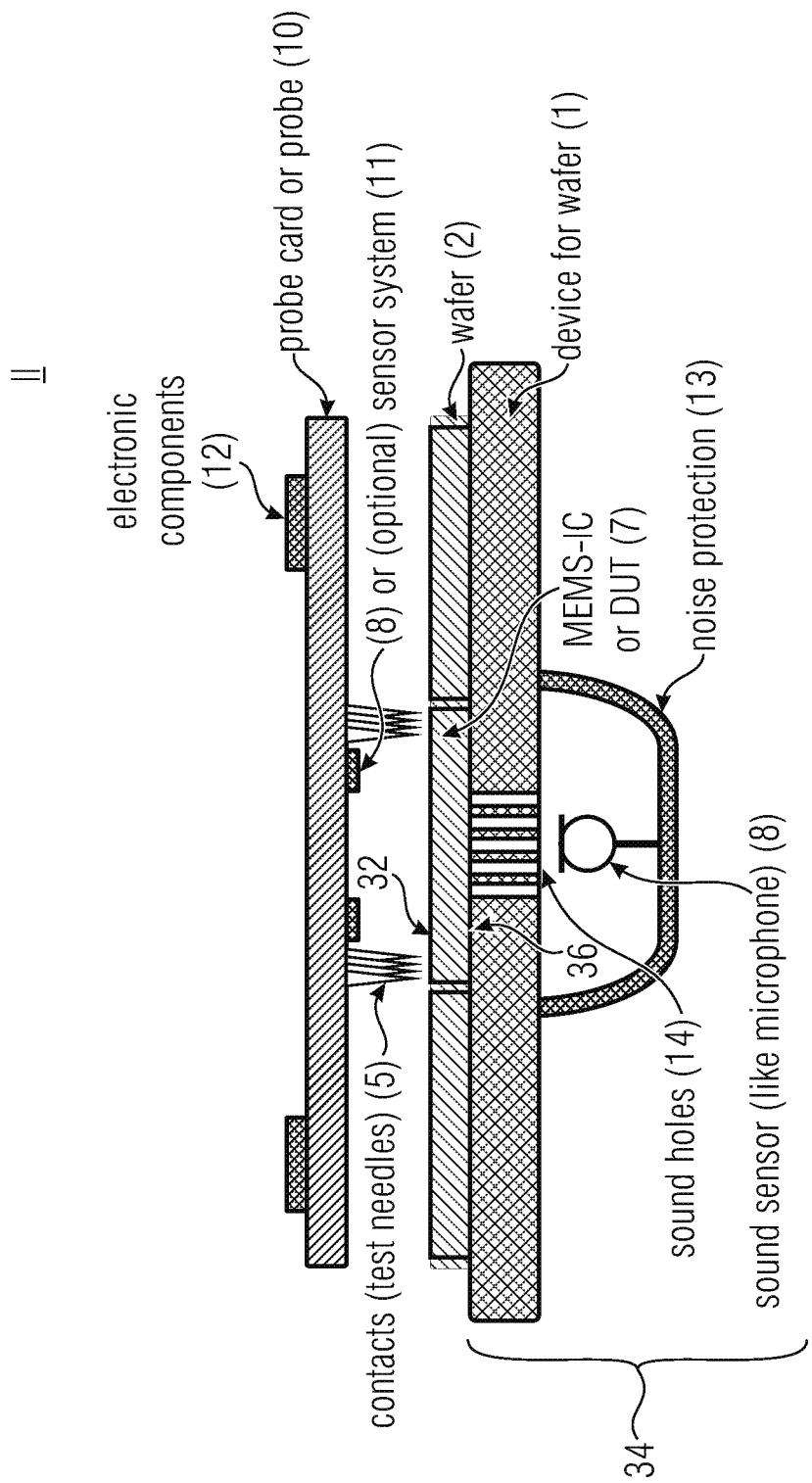
FIG. 9 is a schematic view of an apparatus for acoustically testing an MEMS device of a plurality of MEMS devices on the wafer level using a sound sensor, in accordance with an embodiment.

FIG. 9 shows a schematic view of an apparatus 11 for acoustically testing an MEMS device 7 of a plurality of MEMS devices on the wafer level using a sound sensor 8, in accordance with an embodiment. The apparatus 11 can comprise a first test apparatus 10 (probe card, probe or part of a probe) configured to contact a first side 32 of the at least one MEMS device 7 and excite, for example mechanically or electrically, the at least one MEMS device 7 to an acoustic vibration, for example by means of test needles 5 which contact the contacts 6 of the at least one MEMS device 7. Additionally, the apparatus 11 can comprise a second test apparatus 34 configured to contact a second side 36 of the MEMS device 7, wherein the second test apparatus 34 can comprise at least one sound sensor 8 (like microphone, for example) configured to detect the acoustic vibration of the at least one MEMS device 7.

The at least one sound sensor 8 here can be arranged adjacent to the at least one MEMS device 7, for example in the region of a (back-side) emission angle (like main emission angle) of the acoustic vibration of the at least one MEMS device 7, for example below a region 14 of the test apparatus 10 which is arranged adjacent to the at least one MEMS device 7, and which is at least partly acoustically transmissive (by means of sound holes, for example). Alternatively (or additionally), the sound sensor can also be arranged in the region of the first test apparatus 10 between (or adjacent to) the check needles which contact the MEMS device 7, as is indicated in FIG. 7. The apparatus 11 (like the second test apparatus 34, for example) can optionally (for example if required) comprise an acoustic shielding device 13 (like noise protection) configured to shield the at least one sound sensor 8 from the environment and/or other MEMS devices of the plurality of MEMS devices.

As is exemplarily shown in FIG. 9, the second test apparatus 34 can be part of an accommodation apparatus 1 for accommodating (and for positioning, for example) the wafer 2.

In other words, FIG. 9 shows a so-called single DUT (MEMS device) test by means of a single sound sensor (microphone 8).

Figure 10:
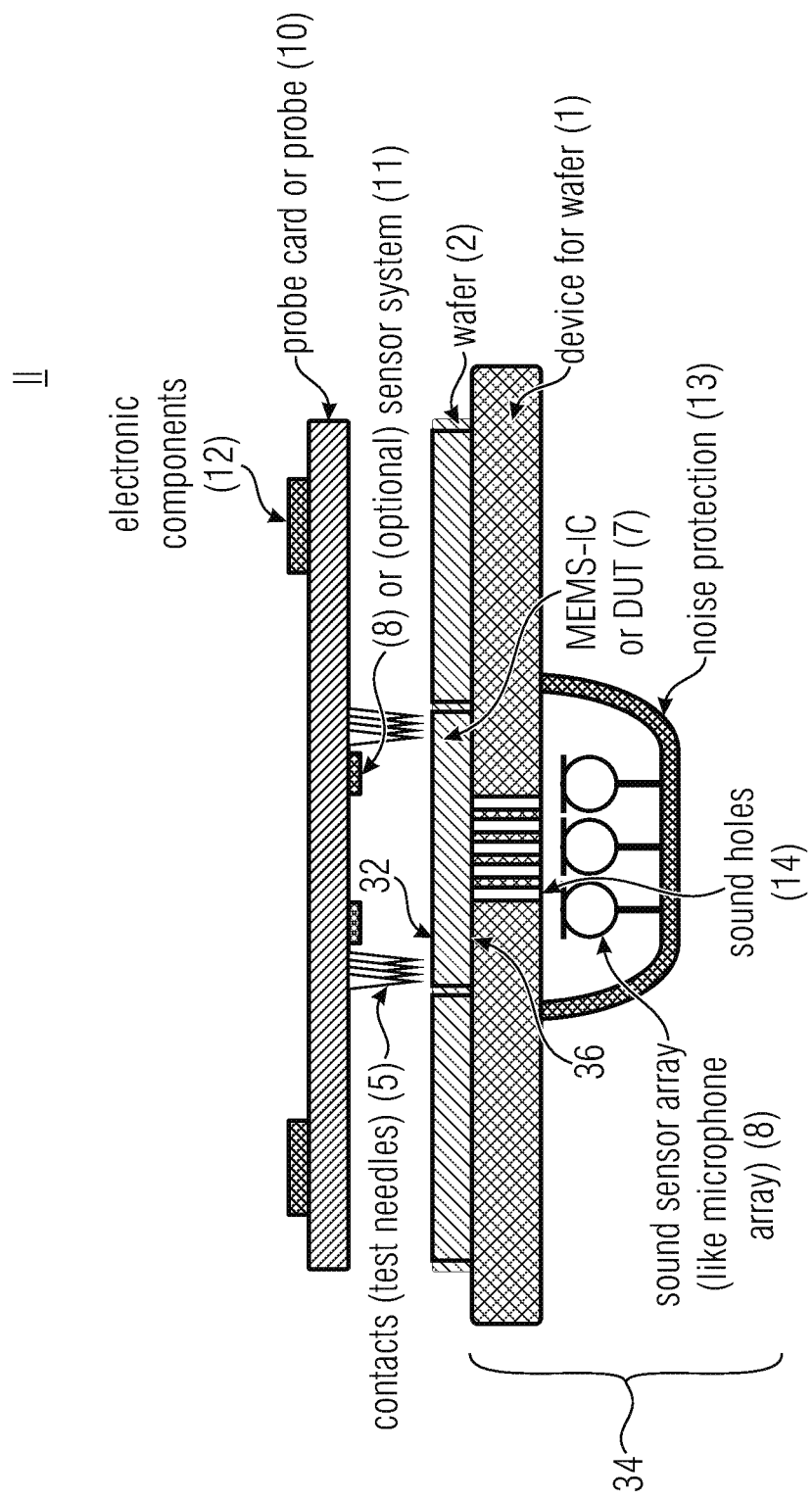
FIG. 10 is a schematic view of an apparatus for acoustically testing an MEMS devices of a plurality of MEMS devices on the wafer level using a sound sensor array, in accordance with an embodiment.

FIG. 10 shows a schematic view of an apparatus 11 for acoustically testing an MEMS device 7 of a plurality of MEMS devices on the wafer level using a sound sensor array 8, in accordance with an embodiment. When compared to the embodiment shown in FIG. 9, in the embodiment shown in FIG. 10, a sound sensor array (like microphone array, for example) 8 can be used for acoustically testing the MEMS device 7, instead of a single sound sensor. In other words, FIG. 10 shows a so-called single DUT (MEMS device) test by means of a sound sensor array (like microphone array, for example).

Figure 11:
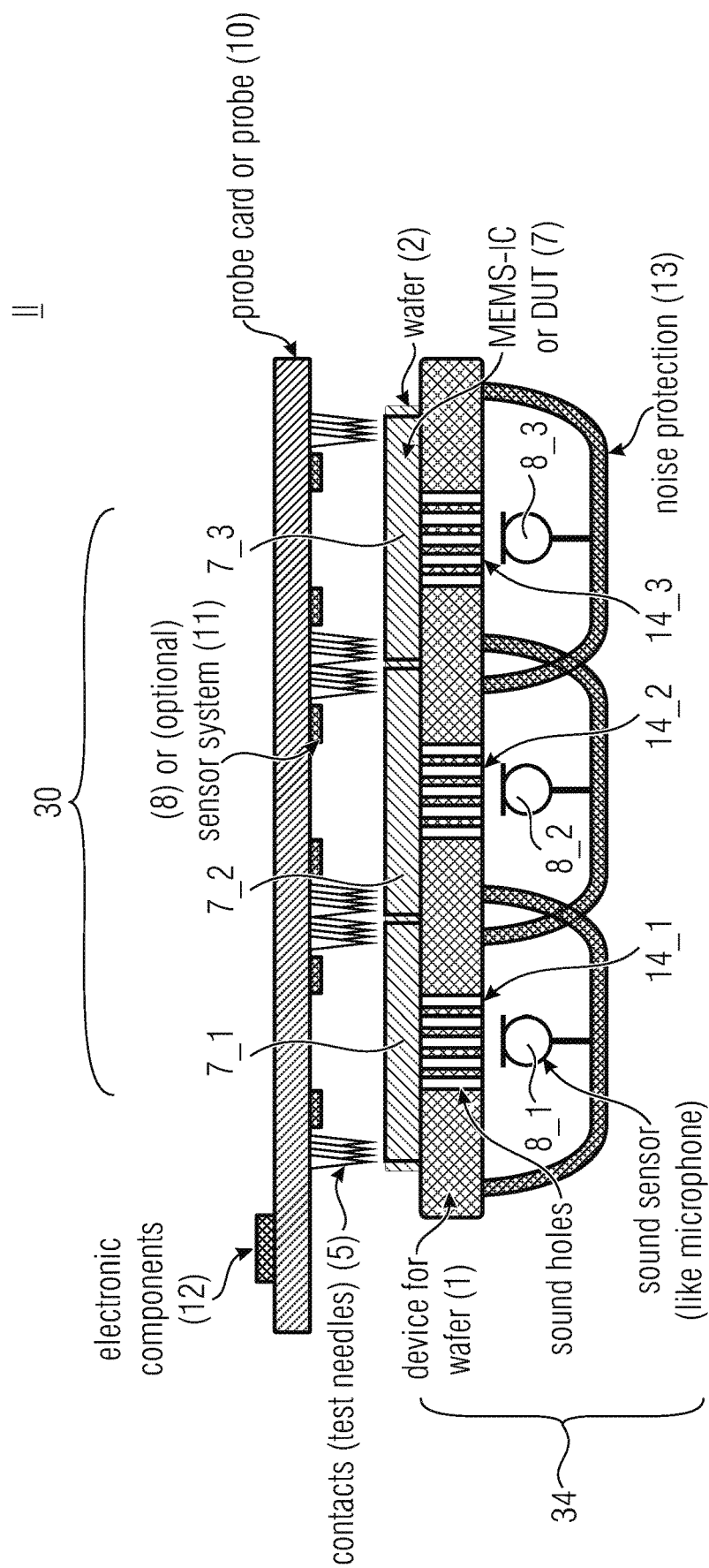
FIG. 11 is a schematic view of an apparatus for acoustically testing a group of MEMS devices of a plurality of MEMS devices on the wafer level using one sound sensor per MEMS device of the group of MEMS devices, in accordance with an embodiment.

FIG. 11 shows a schematic view of an apparatus 11 for acoustically testing a group 30 of MEMS devices 7_1-7_3 of a plurality of MEMS devices on the wafer level using the sound sensor 8_1-8_3 per MEMS device 7_1-7_3 of the group 30 of MEMS devices 7_1-7_3, in accordance with an embodiment. When compared to the embodiment shown in FIG. 10, in the embodiment shown in FIG. 11, a group 30 of MEMS devices 7_1-7_3 can be tested, wherein one sound sensor 8_1-8_3 each is associated to each MEMS device 7_1-7_3 of the group 30 of MEMS devices 7_1-7_3. The sound sensors 8_1-8_3 here can each be arranged adjacent to the respective MEMS device 7_1-7_3 of the group 30 of MEMS devices 7_1-7_3, like below a respective region 14_1-14_3 of the second test apparatus 34, which is arranged adjacent to the respective MEMS device 7_1-7_3, and which is at least partly acoustically transmissive (for example by means of sound holes). Alternatively (or additionally), the respective sound sensors can also be arranged each in the region of the first test apparatus 10 between (or adjacent to) the probe needles which contact the respective MEMS device 7_1-7_3, as is indicated in FIG. 11. In other words, FIG. 11 shows a so-called multiple DUT (MEMS device) test by means of a single sound sensor (like microphone, for example) per DUT.

Figure 12:
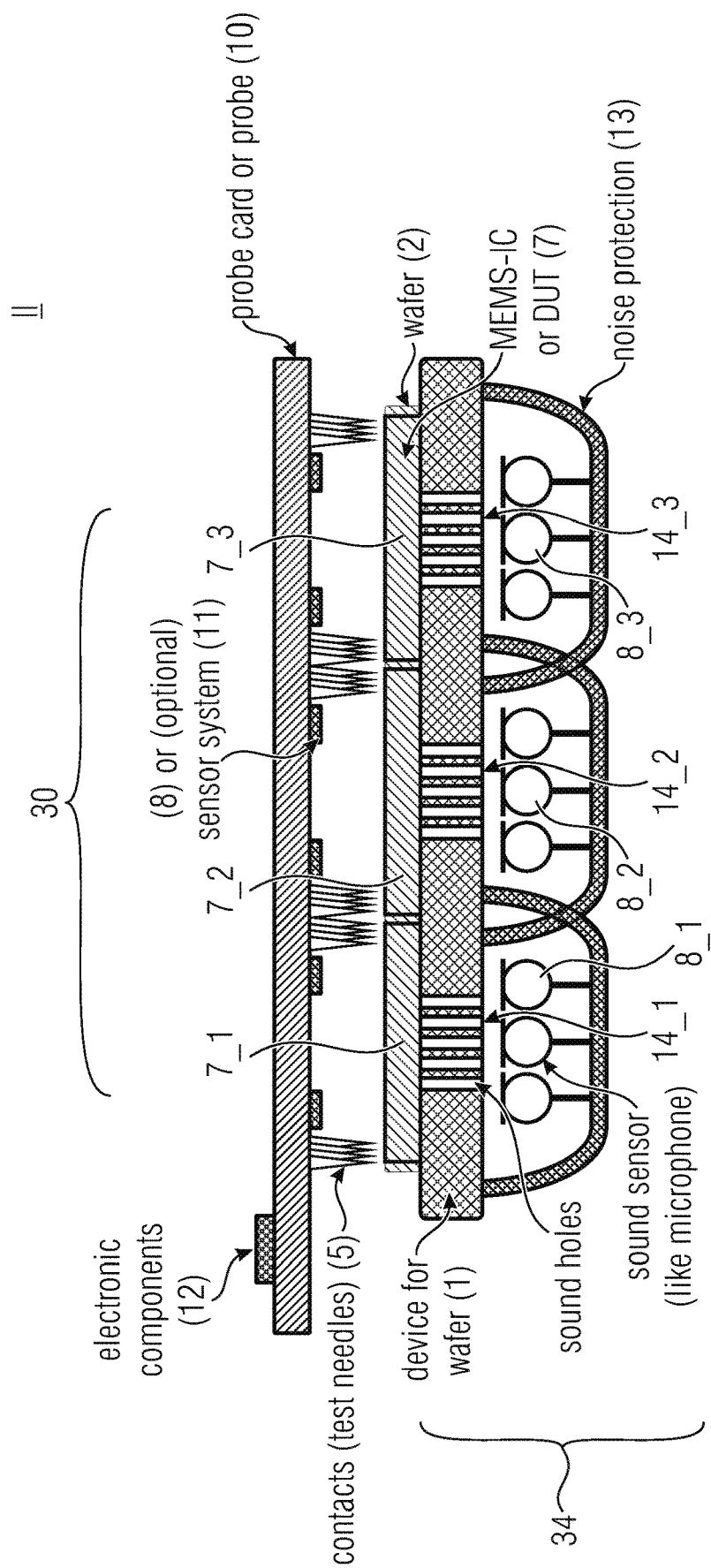
FIG. 12 is a schematic view of an apparatus for acoustically testing a group of MEMS devices of a plurality of MEMS devices on the wafer level using one sound sensor array per MEMS device of the group of MEMS devices, in accordance with an embodiment.

FIG. 12 shows a schematic view of an apparatus 11 for acoustically testing a group 30 of MEMS devices 7_1-7_3 of a plurality of MEMS devices on the wafer level using the sound sensor array 8_1-8_3 per MEMS device 7_1-7_3 of the group 30 of MEMS devices 7_1-7_3, in accordance with an embodiment. When compared to the embodiment shown in FIG. 11, in the embodiment shown in FIG. 12, one sound sensor array 8_1-8_3 can be used per MEMS device 7_1-7_3 of the group 30 of MEMS devices 7_1-7_3, instead of a single sound sensor per MEMS device. In other words, FIG. 12 shows a so-called multiple DUT (MEMS device) test by means of one sound sensor array (like microphone array, for example) per DUT.

Figure 13:
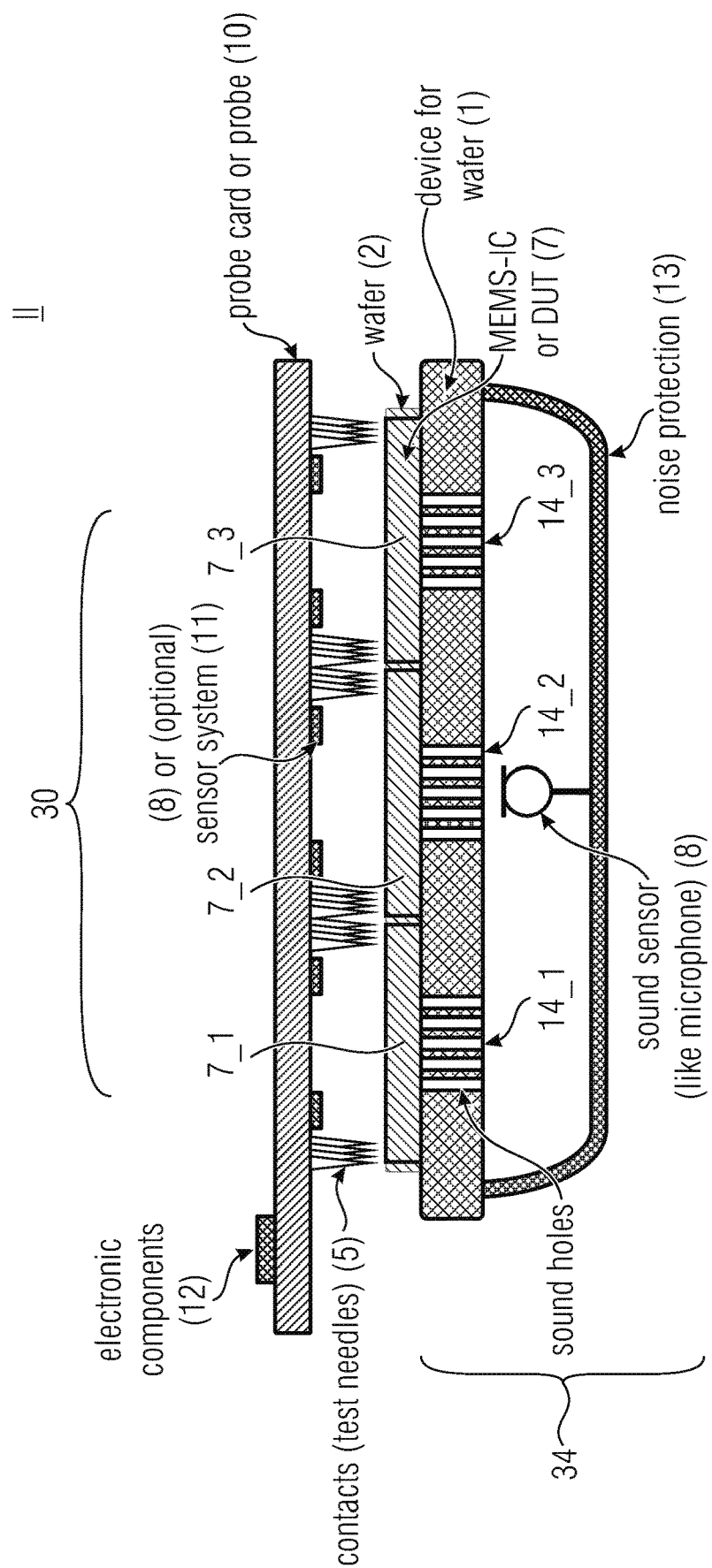
FIG. 13 is a schematic view of an apparatus for acoustically testing a group of MEMS devices of a plurality of MEMS devices on the wafer level using a sound sensor for the group of MEMS devices, in accordance with an embodiment.

FIG. 13 shows a schematic view of an apparatus 11 for acoustically testing a group 30 of MEMS devices 7_1-7_3 of a plurality of MEMS devices on the wafer level using a sound sensor 8 for the group 30 of MEMS devices 7_1-7_3, in accordance with an embodiment. When compared to the embodiment shown in FIG. 11, in the embodiment shown in FIG. 13, a single sound sensor 8 can be used for acoustically testing the group 30 of MEMS devices 7_1-7_3 instead of one sound sensor per MEMS device. In other words, FIG. 13 shows a so-called multiple DUT (MEMS device) test by means of a single sound sensor (like microphone, for example).

Figure 14:
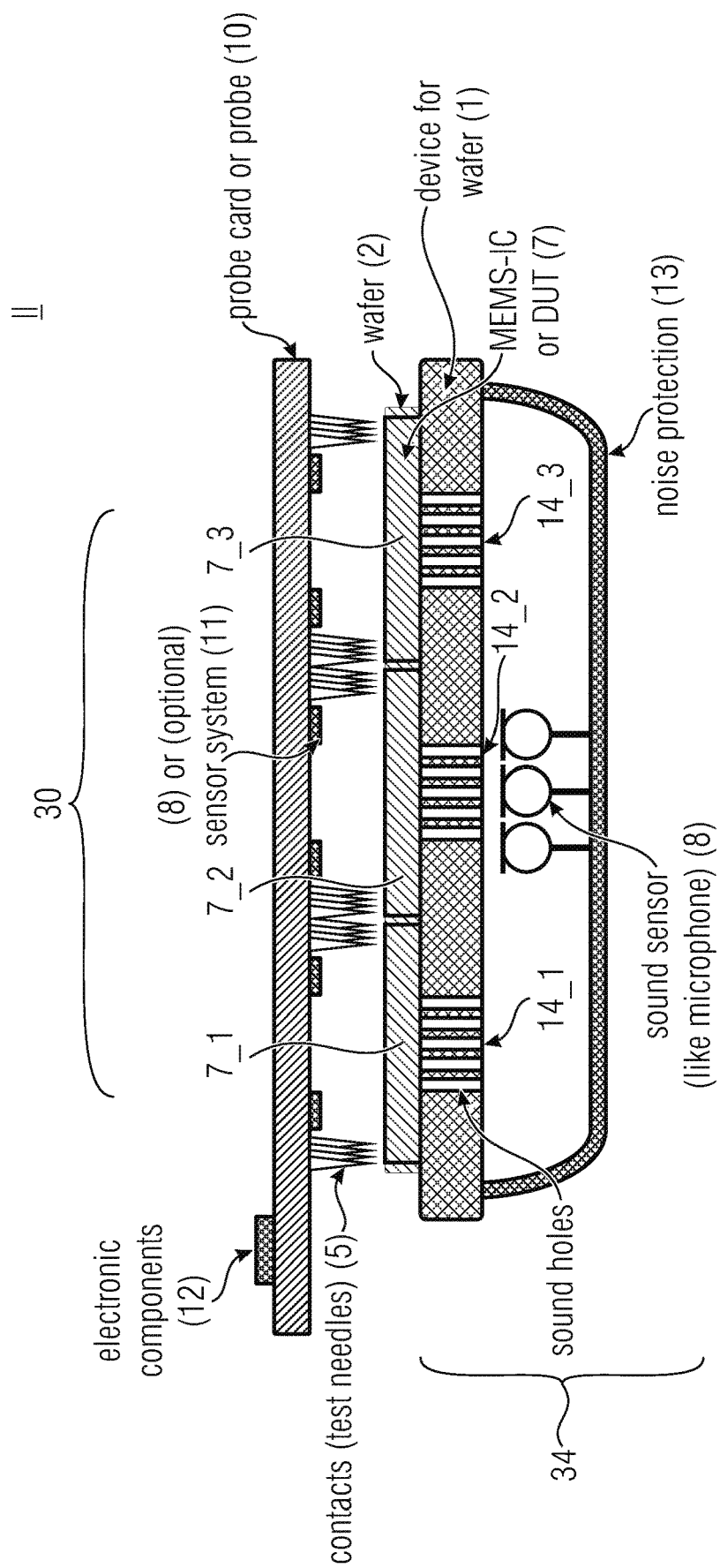
FIG. 14 is a schematic view of an apparatus for acoustically testing a group of MEMS devices of a plurality of MEMS devices on the wafer level using a sound sensor array for the group of MEMS devices, in accordance with an embodiment.

FIG. 14 shows a schematic view of an apparatus 11 for acoustically testing a group 30 of MEMS devices 7_1-7_3 of a plurality of MEMS devices on the wafer level using a sound sensor array 8 for the group 30 of MEMS devices 7_1-7_3, in accordance with an embodiment. When compared to the embodiment shown in FIG. 13, in the embodiment shown in FIG. 8, a sound sensor array 8 can be used for acoustically testing the group 30 of MEMS devices 7_1-7_3, instead of a single sound sensor. In other words, FIG. 14 shows a so-called multiple DUT (MEMS device) test by means of a single sound sensor array (like microphone array, for example).

In embodiments, the so-called acoustic probe testing can be used in manual or semi-automatic processes. Here, the wafer 2 under test is introduced in an apparatus 1 which brings the same to a defined position. The probe 3 including a respective device 4 is applied above the wafer 2 (depending on the setup). An electrical connection to the microscopically small contacts 6 of the individual MEMS-ICs of the DUT 7 is made by means of test needles 5 applied to the probe 3. A microphone 8 or microphone array (see, for example, FIG. 3) which is positioned differently depending on the case of application (see FIGS. 3 to 8 and FIGS. 9 to 14) is positioned within the test needle array. The test needles 5 and the microphone 8 or the microphone array 8 are mounted to the probe 3 at defined positions. The positions result depending on the type and complexity of the MEMS or DUT 7 under test. The probe 3 is applied at the wafer 2 with a defined position and defined contact pressure. The prober 9 initializes the electrical, mechanical or electromechanical signals, performs the acoustic examinations/tests mentioned above and generates an individual acoustic characterization of the MEMS-IC or DUT 7, which decides which functional class the individual MEMS-IC or DUT 7 is allocated to.

1.2 Acoustic Wafer Probe Card Testing

Figure 15:
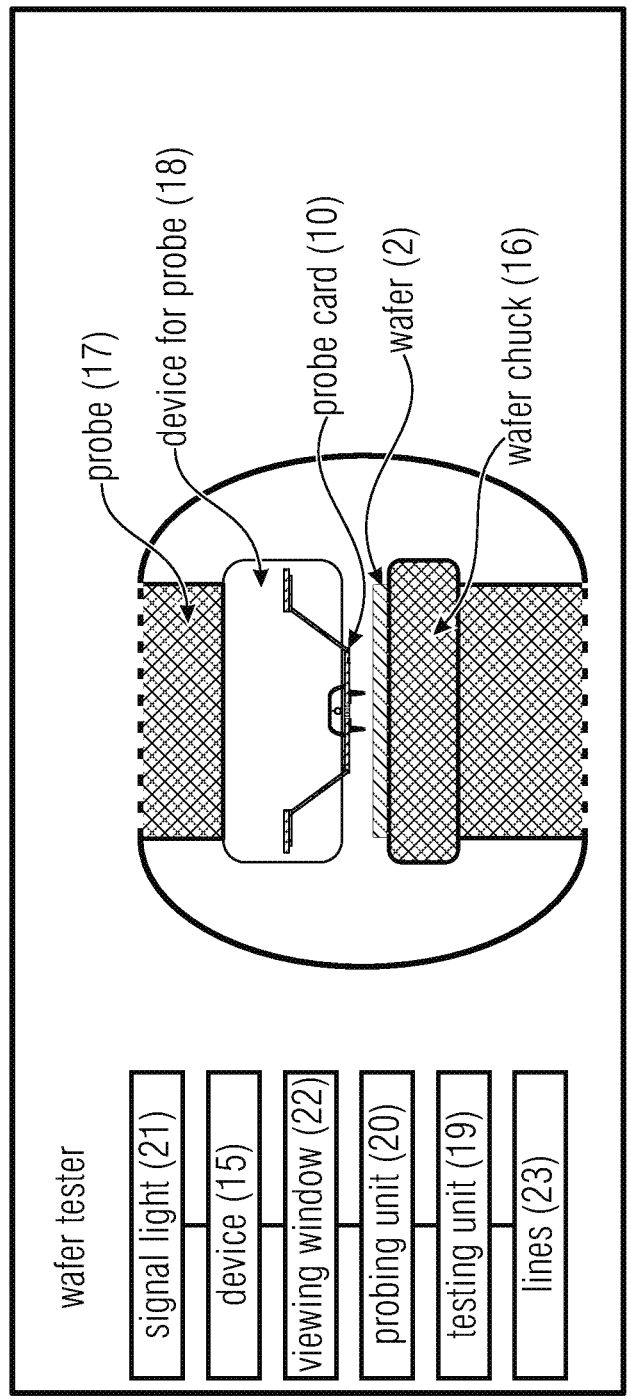
FIG. 15 is a schematic view of a wafer tester having a probe where the embodiments described in FIGS. 3 to 14 can be employed.

FIG. 15 shows a schematic view of a wafer prober having a probe 17, a device 18 for the probe, a probe card 10 and an accommodation device 16 for the wafer (wafer chuck), wherein the embodiments described before in FIGS. 3 to 14 can be used in the wafer prober. In particular, the test apparatus 10 described in FIGS. 3 to 8, for example in the form of a probe card 10 between probe 17 and wafer 2, can be used to acoustically test at least one MEMS device of the wafer 2. Of course, the test apparatuses 10 and 34 described in FIGS. 9 to 14 can also be used, wherein the first apparatus 10, for example in the form of a probe card 10 between probe 17 and wafer 2, can be used, and wherein the second test apparatus 34 between wafer 2 and wafer chuck 16 or in the form of an (extended) wafer chuck 16 can be used. In other words, FIG. 15 shows a so-called wafer prober having a so-called acoustic wafer probe testing probe.

In embodiments, in fully automatic processes, the so-called acoustic wafer probe card testing can be used. Here, the wafer 2 under test is introduced in a device 15 on a wafer chuck 16. The probe 17 applied above the wafer 2, including a respective device 18, comprises an interface (for example between the probe 18 and the probe card 10) to the probe card 10 using which the wafer 2 is tested. The test needles 5 attached to the probe card 10 make electrical contact to the microscopically small contacts 6 (cf. FIG. 2) of the individual MEMS ICs or DUT 7 (cf. FIG. 2). Within the test needle array, a microphone or microphone array 8 (cf. FIG. 2) is present which is positioned differently, depending on the application case (see FIGS. 2 to 14). The test needles and the microphone or microphone array are applied at defined positions of the probe card. The positions result in dependence on the type and complexity of the MEMS or DUT 7 under test. Thus, the size of the probe card defines the maximum number of MEMSs or DUTs possible. The probe having the probe card is applied to the wafer with a defined position and a defined contact pressure. The prober 19 initializes the electrical, mechanical or electromechanical signals, performs the acoustic checks/tests mentioned above and produces an individual acoustic characterization of the MEMS IC or DUT, which decides which functional class the individual MEMS IC or DUT is allocated to. Additionally, the prober 20 can subject the MEMS ICs or DUTs presently under test using the prober to further electrical tests. The test process can be checked by the visual field 22. The status of the machine can be recognized by means of the signal light 21. The color coding here can, for example, be as follows: red—error in the program flow or functional error in the machine, yellow—warning for the current program flow or warning for a machine function, green—program or machine function finished successfully. All sub-units are connected to lines (like cable bundles) 23.

2. Assembly Testing/Testing During Assembly

Figure 16:
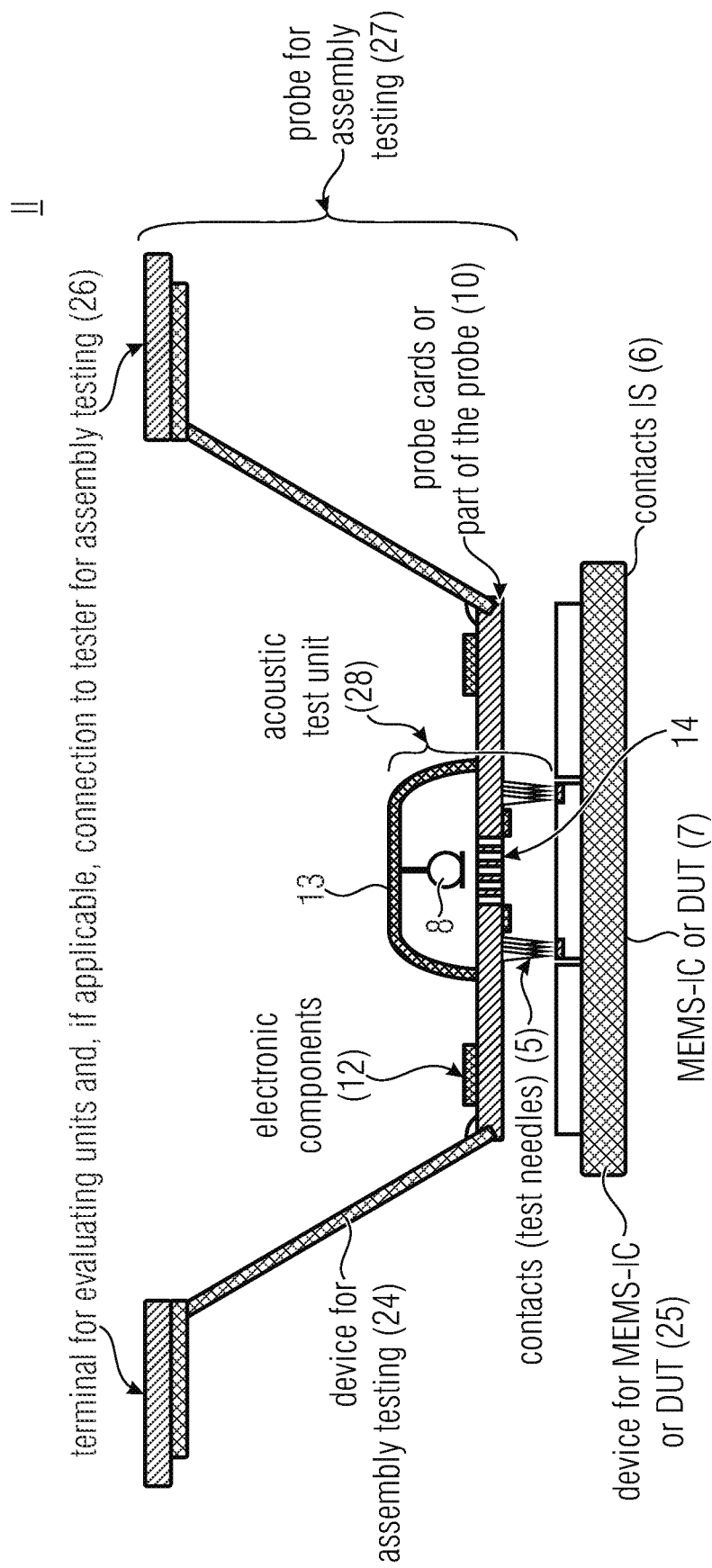
FIG. 16 is a schematic view of an apparatus for acoustically testing at least one MEMS device after molding/packaging the at least one MEMS device, in accordance with an embodiment.

FIG. 16 shows a schematic view of an apparatus 11 for acoustically testing at least one MEMS device 7 after molding/packaging the at least one MEMS device, in accordance with an embodiment.

The apparatus 11 can comprise an accommodation device 25 for accommodating (and, for example, for positioning) the at least one MEMS device, like an integrated circuit having the at least one MEMS device. In addition, the apparatus 11 can comprise a test apparatus 10 (like a probe card or part of a probe) configured to contact the at least one MEMS device 7 and excite, for example mechanically or electrically, the at least one MEMS device 7 to an acoustic vibration, by means of test needles 5, for example, which contact the contacts 6 of the at least one MEMS device 7. The test apparatus 10 can additionally comprise at least one sound sensor 8 (like microphone) configured to detect the acoustic vibration of the at least one MEMS device 7.

The at least one sound sensor 8 here can be arranged adjacent to the at least one MEMS device 7, for example in the region of an emission angle (like main emission angle) of the acoustic vibration of the at least one MEMS device 7, like in the region between (or adjacent to) the test needles 5 which contact the at least one MEMS device 7, and/or above a region 14 of the test apparatus 10 which is arranged adjacent to the at least one MEMS device 7, and which is at least partly acoustically transmissive (for example by means of sound holes). The apparatus 11 (for example the test apparatus 10) can optionally (for example if required) comprise an acoustic shielding device 13 (like noise protection) configured to shield the at least one sound sensor 8 from the environment and/or other MEMS devices of the plurality of MEMS devices.

As is exemplarily shown in FIG. 16, the test apparatus 10 can be a probe card or part of a probe 27 of the apparatus 11. The probe 27 can exemplarily comprise a device 24 for the probe card 10 and, for example, electronic components 12 and, if applicable, a connection 26 to evaluation units and, if applicable, connection to a prober.

In other words, FIG. 16 shows an embodiment of the so-called assembly testing or testing during assembly using the so-called acoustic post-molding/packaging testing.

In embodiments, after the process of molding/packaging where the individual MEMS (ICs) or DUTs are embedded in epoxy resin, for example, the finished individualized MEMS (ICs) or DUTs can be subjected to acoustic testing and acoustic characterization in the subsequent final semiconductor tests—the so-called acoustic post-molding/packaging testing. The test stand comprises a device 24 and 25, depending on the packaging, for positioning and fixing the MEMS IC or DUT 7. It accommodates the MEMS IC or DUT 7. The probe 27, including the acoustic test unit 28, which has a different setup depending on the application case (see embodiments of FIGS. 2 to 14), is positioned above the MEMS IC or DUT 7 and makes a defined connection via the contacts 6. The prober 19 (see FIG. 15) initializes the electrical, mechanical or electromechanical signals, performs the acoustic checks/tests mentioned above and produces an individual acoustic characterization of the MEMS IC or DUT, which decides which functional class the individual MEMS IC or DUT is allocated to. Furthermore, the prober 20 (see FIG. 15) can subject the MEMS ICs or DUTs 7 presently under test using the prober to further electrical tests.

3. Production Line Testing 3.1 Acoustic In-Line-Testing

Figure 17:
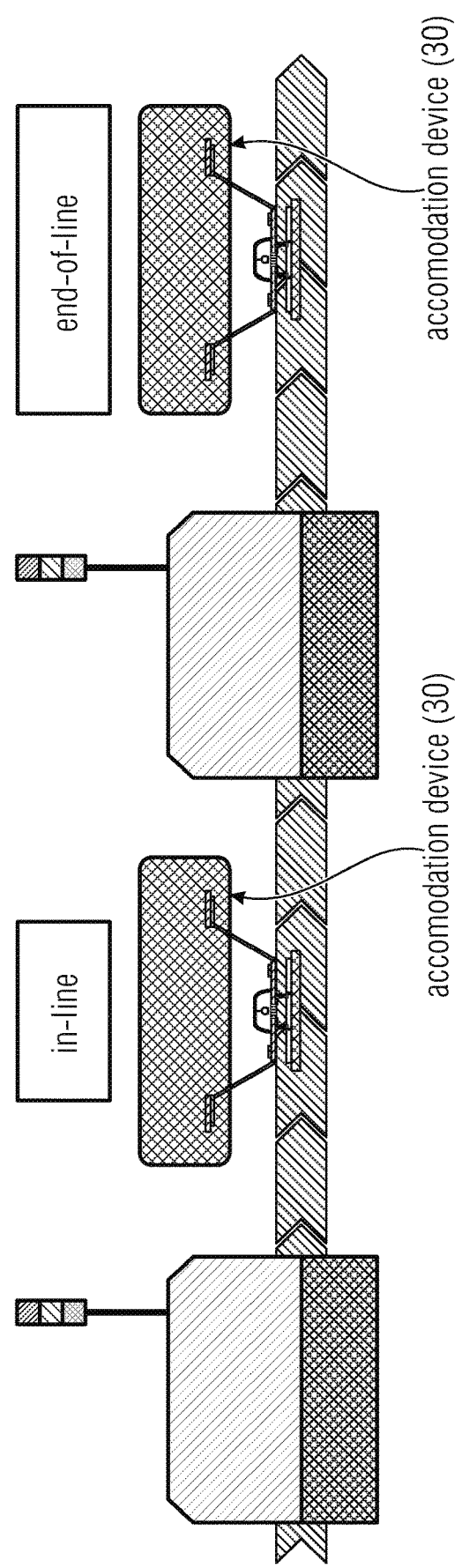
FIG. 17 is a schematic view of acoustically checking at least one MEMS device in the product line and at the end of the production line.

The so-called Acoustic In-Line-Testing describes a process in which the sub-products are subjected to acoustic testing and acoustic characterization between the individual product manufacturing steps, as is shown in FIG. 17.

In detail, FIG. 17 shows a schematic view of acoustically testing at least one MEMS device in the production line (In-Line) and at the end of the production line (End-of-Line). In other words, FIG. 17 shows positions for the so-called production line testing, i.e. the so-called Acoustic In-Line Testing and the so-called Acoustic End-of-Line Testing by means of a special accommodation device having a special probe device.

The accommodation device 30 specific for the application case holds the DUT. The probe 27 (see FIG. 16) having the acoustic test unit 28 (see FIG. 16) is positioned above the DUT. The prober 19 (see FIG. 15) initializes the electrical, mechanical or electromechanical signals, performs the acoustic checks/tests mentioned above and produces an individual acoustic characterization of the DUT, which decides whether the DUT is suitable for continued production, is to be repaired or rejected. Another aspect of this embodiment is the possibility of classifying up to identifying individual chips. Markings located on the MEMS for associating the chips to a position and time of the production can be added with this method for recognizing purposes.

3.2 Acoustic End-of-Line Testing

The so-called Acoustic End-of-Line Testing describes a process which subjects the final product to acoustic testing and acoustic characterization at the end of one or several production chains. The accommodation device 30 specific for the application case holds the DUT. The probe 27 (see FIG. 16) having the acoustically test unit 28 (see FIG. 16) is positioned above the DUT. The prober 19 (see FIG. 15) initializes the electrical or mechanical or electromechanical signals and performs the acoustic checks/tests mentioned above and produces an individual acoustic characterization of the DUT, which decides whether the DUT complies with the defined quality requirements or whether it is rejected.

3.3 Operation of the Final Application of the MEMS

All the methods mentioned before as sub-aspects are used when the MEMS in the final application is monitored during operation, characterized and driving is tracked. Signal processing by a computer program is used here which performs driving using the energy converted in the system. Fed by data from the previously mentioned embodiments, the behavior is evaluated using the parameters achieved before, with no continuous acoustic characterization, and driving is adjusted to the MEMS state.

4. Further Embodiments

Using the embodiments described herein, there is a way of acoustically evaluating the conversion of electrical energy received by the MEMS. Exemplarily (for example by means of a computer program), in one, more or each step of the value chain, allocation to a probability with which the device will function in relation to predetermined parameters and as to whether further processing thereof is sensible from an economic point of view can be performed. The type of energy which was converted from electrical energy to thermal and acoustic energy (like airborne sound) can be used for evaluating. In further embodiments, electromagnetic waves can be detected using the arrangement.

Although embodiments were described herein in which the acoustic vibration generated by the MEMS devices was detected directly by means of a sound sensor, it is to be pointed out that, in embodiments, acoustic filters can also be provided in the sound path. Additionally, it is to be pointed out that, in driving, amplifiers or signal processing devices can be provided.

In embodiments, the energy distribution in the MEMS can be detected and, for example, evaluated.

In embodiments (for example using a computer program), an acoustic characterization for evaluating the signals or signal classes of the energy emitted and measured by means of sound sensors (like microphones, for example) can be performed. Methods for compensating non-linear behavior can be employed here.

It is to be pointed out that MEMS devices of reduced size are also to be understood to be MEMS devices, like NEMS (nanoelectromechanical system) devices or even further miniaturized electromechanical systems.

Although some aspects have been described in the context of an apparatus, it is clear that these aspects also represent a description of the corresponding method, such that a block or device of an apparatus also corresponds to a corresponding method step or a feature of a method step. Analogously, aspects described in the context of or as a method step also represent a description of a corresponding block or item or feature of a corresponding apparatus. Some or all of the method steps may be executed by (or using) a hardware apparatus, like a microprocessor, a programmable computer or an electronic circuit, for example. In some embodiments, some or several of the most important method steps may be executed by such an apparatus.

Depending on certain implementation requirements, embodiments of the invention can be implemented in hardware or in software. The implementation can be performed using a digital storage medium, for example a floppy disk, DVD, Blu-Ray disc, CD, ROM, PROM, EPROM, EEPROM or a FLASH memory, a hard drive or another magnetic or optical memory having electronically readable control signals stored thereon, which cooperate or are capable of cooperating with a programmable computer system such that the respective method is performed. Therefore, the digital storage medium may be computer-readable.

Some embodiments according to the invention include a data carrier comprising electronically readable control signals, which are capable of cooperating with a programmable computer system such that one of the methods described herein is performed.

Generally, embodiments of the present invention can be implemented as a computer program product with program code, the program code being operative for performing one of the methods when the computer program product runs on a computer.

The program code may, for example, be stored on a machine-readable carrier.

Other embodiments comprise the computer program for performing one of the methods described herein, wherein the computer program is stored on a machine-readable carrier.

In other words, an embodiment of the inventive method is, therefore, a computer program comprising program code for performing one of the methods described herein, when the computer program runs on a computer.

A further embodiment of the inventive methods is, therefore, a data carrier (or a digital storage medium or a computer-readable medium) comprising, recorded thereon, the computer program for performing one of the methods described herein. The data carrier, the digital storage medium or the computer-readable medium are typically tangible and/or non-transitory or non-volatile.

A further embodiment of the inventive method is, therefore, a data stream or a sequence of signals representing the computer program for performing one of the methods described herein. The data stream or the sequence of signals may, for example, be configured to be transferred via a data communication connection, for example via the Internet.

A further embodiment comprises processing means, for example a computer, or a programmable logic device, configured or adapted to perform one of the methods described herein.

A further embodiment comprises a computer having installed thereon the computer program for performing one of the methods described herein.

A further embodiment according to the invention comprises an apparatus or a system configured to transfer a computer program for performing at least one of the methods described herein to a receiver. The transmission can, for example, be performed electronically or optically. The receiver may, for example, be a computer, a mobile device, a memory device or the like. The apparatus or system may, for example, comprise a file server for transferring the computer program to the receiver.

In some embodiments, a programmable logic device (for example a field-programmable gate array, FPGA) may be used to perform some or all of the functionalities of the methods described herein. In some embodiments, a field-programmable gate array may cooperate with a microprocessor in order to perform one of the methods described herein. Generally, in some embodiments, the methods are performed by any hardware apparatus. This can be universally applicable hardware, such as a computer processor (CPU), or hardware specific for the method, such as ASIC.

The apparatuses described herein can, for example, be implemented using a hardware apparatus, or using a computer, or using a combination of a hardware apparatus and a computer.

The apparatuses described herein, or any components of the apparatuses described herein, can be implemented, at least partly, in hardware and/or in software (computer program).

The methods described herein can, for example, be implemented using a hardware apparatus, or using a computer, or using a combination of a hardware apparatus and a computer.

The methods described herein, or any components of the methods described herein, can be executed, at least partly, by hardware and/or by software.

While this invention has been described in terms of several embodiments, there are alterations, permutations, and equivalents which fall within the scope of this invention. It should also be noted that there are many alternative ways of implementing the methods and compositions of the present invention. It is therefore intended that the following appended claims be interpreted as including all such alterations, permutations and equivalents as fall within the true spirit and scope of the present invention.

The invention claimed is:

1. A method for acoustically testing at least one MEMS device of a plurality of MEMS devices, wherein the method comprises:
    providing the plurality of MEMS devices with the at least one MEMS device to be acoustically tested,
    providing a test apparatus and contacting the at least one MEMS device by the test apparatus via electrical contacts,
    exciting the at least one MEMS device via the electrical contacts of the test apparatus to an acoustic vibration,
    detecting the acoustic vibration of the at least one MEMS device by at least one sound sensor of the test apparatus,
    evaluating the acoustic vibration of the at least one MEMS device, detected by the at least one sound sensor, to test the at least one MEMS device as to an intended functionality,
    wherein the test apparatus is a probe, part of a probe or a test card.

2. The method in accordance with claim 1,
    wherein the at least one MEMS device is tested on a wafer level before dicing the plurality of MEMS devices,
    or wherein the at least one MEMS device is tested after dicing the plurality of MEMS devices.

3. The method in accordance with claim 1,
    wherein the test apparatus is at least partly acoustically transmissive at least in a region adjacent to the at least one MEMS device,
    wherein the at least one sound sensor is arranged adjacent to the at least partly acoustically transmissive region of the test apparatus.

4. The method in accordance with claim 3,
    wherein the at least one MEMS device is among a group of MEMS devices to be acoustically tested,
    wherein the test apparatus is at least partly acoustically transmissive at least in regions adjacent to the group of MEMS devices,
    wherein the at least one sound sensor is arranged adjacent to the at least partly acoustically transmissive regions of the test apparatus.

5. The method in accordance with claim 1,
    wherein the at least one MEMS device is among a group of MEMS devices to be acoustically tested,
    wherein the group of MEMS devices is excited to acoustic vibrations,
    wherein the acoustic vibrations of the group of MEMS devices are detected by the at least one sound sensor.

6. The method in accordance with claim 5,
    wherein the at least one sound sensor is precisely one sound sensor associated to the group of MEMS devices,
    or wherein the at least one sound sensor comprises precisely one sound sensor array associated to the group of MEMS devices.

7. The method in accordance with claim 5,
    wherein the at least one sound sensor comprises a plurality of sound sensors, wherein one sound sensor each of the plurality of sound sensors is associated to a MEMS device of the group of MEMS devices,
    or wherein the at least one sound sensor comprises a plurality of sound sensor arrays, wherein one sound sensor array each of the plurality of sound sensor arrays is associated to a MEMS device of the group of MEMS devices.

8. The method in accordance with claim 7,
wherein the plurality of sound sensors or sound sensors arrays are mutually acoustically shielded,
and/or wherein the MEMS devices of the group of MEMS devices are mutually acoustically shielded.

9. The method in accordance with claim 5,
wherein the group of MEMS devices are excited simultaneously by different signals which do not overlap in frequency.

10. The method in accordance with claim 5,
wherein the group of MEMS devices are excited simultaneously by different signals which overlap in frequency.

11. The method in accordance with claim 5,
wherein the group of MEMS devices are excited successively by the same signal.

12. The method in accordance with claim 8,
wherein the group of MEMS devices are excited simultaneously.

13. The method in accordance with claim 1,
wherein the at least one MEMS device is a MEMS loudspeaker, MEMS microphone, MEMS pump, MEMS drive, MEMS transmission or MEMS-based medical test apparatus.

14. The method in accordance with claim 1,
wherein the at least one sound sensor is a microphone or a structure-borne sound sensor.

15. A method for acoustically testing at least one MEMS device:
providing the at least one MEMS device,
exciting the at least one MEMS device to an acoustic vibration,
detecting the acoustic vibration of the at least one MEMS device by at least one sound sensor,
evaluating the acoustic vibration of the at least one MEMS device, detected by the at least one sound sensor, to test the at least one MEMS device as to an intended functionality,
providing a first test apparatus and contacting via electrical contacts a first side of the at least one MEMS device by the first test apparatus, wherein the at least one MEMS device is excited via the electrical contacts of the first test apparatus,
providing a second test apparatus and contacting a second side of the at least one MEMS device opposite the first side by the second test apparatus, wherein the second test apparatus comprises the at least one sound sensor.

16. The method in accordance with claim 15,
wherein the second test apparatus comprises a support for a wafer, wherein the support is at least partly acoustically transmissive at least in a region adjacent to the at least one MEMS device, and
wherein the at least one sound sensor is arranged adjacent to the at least partly acoustically transmissive regions of the support.

17. The method in accordance with claim 16,
wherein the at least one MEMS device is among a group of MEMS devices to be acoustically tested,
wherein the support is at least partly acoustically transmissive at least in regions adjacent to the group of MEMS devices,
wherein the at least one sound sensor is arranged adjacent to the at least partly acoustically transmissive regions of the support.

18. A method for acoustically testing at least one MEMS device:
providing the at least one MEMS device,
providing a test apparatus and contacting the at least one MEMS device by the test apparatus via electrical contacts,
exciting the at least one MEMS device to an acoustic vibration via the electrical contacts,
detecting the acoustic vibration of the at least one MEMS device by at least one sound sensor,
evaluating the acoustic vibration of the at least one MEMS device, detected by the at least one sound sensor, to test the at least one MEMS device as to an intended functionality,
wherein the at least one MEMS device is a group of MEMS devices,
wherein the group of MEMS devices is excited to acoustic vibrations,
wherein the acoustic vibrations of the group of MEMS devices are detected by the at least one sound sensor,
wherein the at least one sound sensor comprises a plurality of sound sensors, wherein one sound sensor each of the plurality of sound sensors is associated to an MEMS device of the group of MEMS devices,
or wherein the at least one sound sensor comprises a plurality of sound sensor arrays, wherein one sound sensor array each of the plurality of sound sensor arrays is associated to a MEMS device of the group of MEMS devices.

19. The method in accordance with claim 18,
wherein the plurality of sound sensors or sound sensors arrays are mutually acoustically shielded,
and/or wherein the MEMS devices of the group of MEMS devices are mutually acoustically shielded.

20. The method in accordance with claim 18,
wherein the group of MEMS devices are excited simultaneously by different signals which do not overlap in frequency.

21. The method in accordance with claim 18,
wherein the group of MEMS devices are excited simultaneously by different signals which overlap in frequency.

22. The method in accordance with claim 18,
wherein the group of MEMS devices are excited successively by the same signal.

23. A method for acoustically testing at least one MEMS device of an integrated circuit or chip during manufacturing of the integrated circuit or chip:
providing a partial product of the integrated circuit or chip with the at least one MEMS device,
providing a test apparatus and contacting the at least one MEMS device by the test apparatus via electrical contacts,
exciting the at least one MEMS device to an acoustic vibration via the electrical contacts,
detecting the acoustic vibration of the at least one MEMS device by at least one sound sensor,
evaluating the acoustic vibration of the at least one MEMS device, detected by the at least one sound sensor, to test the at least one MEMS device as to an intended functionality.

24. A non-transitory digital storage medium having a computer program stored thereon to perform the method for acoustically testing at least one MEMS device of a plurality of MEMS devices, wherein the method comprises:
providing the plurality of MEMS devices with the at least one MEMS device to be acoustically tested, providing a test apparatus and contacting the at least one MEMS device by the test apparatus via electrical contacts, exciting the at least one MEMS device via the electrical contacts of the test apparatus to an acoustic vibration, detecting the acoustic vibration of the at least one MEMS device by at least one sound sensor of the test apparatus, evaluating the acoustic vibration of the at least one MEMS device, detected by the at least one sound sensor, to test the at least one MEMS device as to an intended functionality, wherein the test apparatus is a probe, part of a probe or a test card, when said computer program is run by a computer.

25. A test apparatus for acoustically testing at least one MEMS device of a plurality of MEMS devices arranged on a wafer, wherein the test apparatus is configured to contact at least one MEMS device of the plurality of MEMS devices arranged on the wafer via electrical contacts, wherein the test apparatus is configured to excite the at least one MEMS device to an acoustic vibration via the electrical contacts, wherein the test apparatus comprises at least one sound sensor configured to detect the acoustic vibration of the at least one MEMS device, wherein the test apparatus is configured to provide at least one signal which is dependent on the acoustic vibration of the at least one MEMS device detected by the sound sensor, wherein the test apparatus is a probe, part of a probe or a test card.

26. An apparatus for acoustically testing at least one MEMS device of a plurality of MEMS devices arranged on a wafer, wherein the apparatus comprises a first test apparatus and a second test apparatus, wherein the first test apparatus is configured to contact a first side of the at least one MEMS device of the plurality of MEMS devices arranged on the wafer via electrical contacts, wherein the first test apparatus is configured to excite the at least one MEMS device to an acoustic vibration via the electrical contacts, wherein the second test apparatus is configured to contact a second side of the at least one MEMS device opposite the first side, wherein the second test apparatus comprises at least one sound sensor configured to detect the acoustic vibration of the at least one MEMS device, wherein the apparatus is configured to evaluate the acoustic vibration of the at least one MEMS device detected by the at least one sound sensor to test the at least one MEMS device as to an intended functionality.

* * * * *